United States Patent [19]

Guinea et al.

[11] Patent Number: 4,862,485
[45] Date of Patent: Aug. 29, 1989

[54] QUOTIENT PHASE-SHIFT PROCESSOR FOR DIGITAL PHASE-LOCKED-LOOPS

[75] Inventors: Jesus Guinea, Santa Clara; Hee Wong, San Jose, both of Calif.

[73] Assignee: National Semiconductor Corporation, Santa Clara, Calif.

[21] Appl. No.: 108,371

[22] Filed: Oct. 14, 1987

[51] Int. Cl.$^4$ ............................................. H03L 7/06
[52] U.S. Cl. ...................................... 375/120; 328/74
[58] Field of Search ............... 375/81, 108, 110, 119, 375/120; 360/51; 328/72, 74, 155; 331/1 A, 18

[56] References Cited

U.S. PATENT DOCUMENTS

| | | | |
|---|---|---|---|
| 4,385,396 | 5/1983 | Norton | 375/110 |
| 4,534,044 | 8/1985 | Funke et al. | 375/120 |
| 4,633,193 | 12/1986 | Scordo | 375/108 |
| 4,713,630 | 12/1987 | Matthews | 375/120 |

*Primary Examiner*—Benedict V. Safourek
*Attorney, Agent, or Firm*—Limbach, Limbach & Sutton

[57] ABSTRACT

A quotient phase-shift processor is provided which includes novel techniques for realizing phase corrections of a digital phase-locked-loop. A binary phase-detector of the "early-late" type is combined with range-phase-detector circuitry to generate a variable lock acquisition speed. Phase measure and speed control are performed by incremental manipulation which feeds a novel "quotient" processor. The quotient processor integrates the incremental phase errors and performs phase corrections in a nonperiodic fashion, resulting in lower effective proportional loop gain than that provided in standard phase-locked-loops. Wide capture-range and low jitter are obtained by dynamically varying a loop time constant. Pattern dependent noise is reduced by a novel gating technique. High crystal-frequency requirements are reduced, extending the spectral application of digital phase-locked-loops.

9 Claims, 37 Drawing Sheets

Microfiche Appendix Included
(1 Microfiche, 31 Pages)

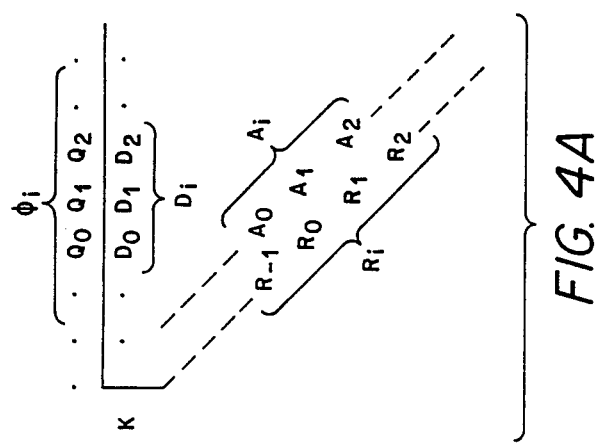

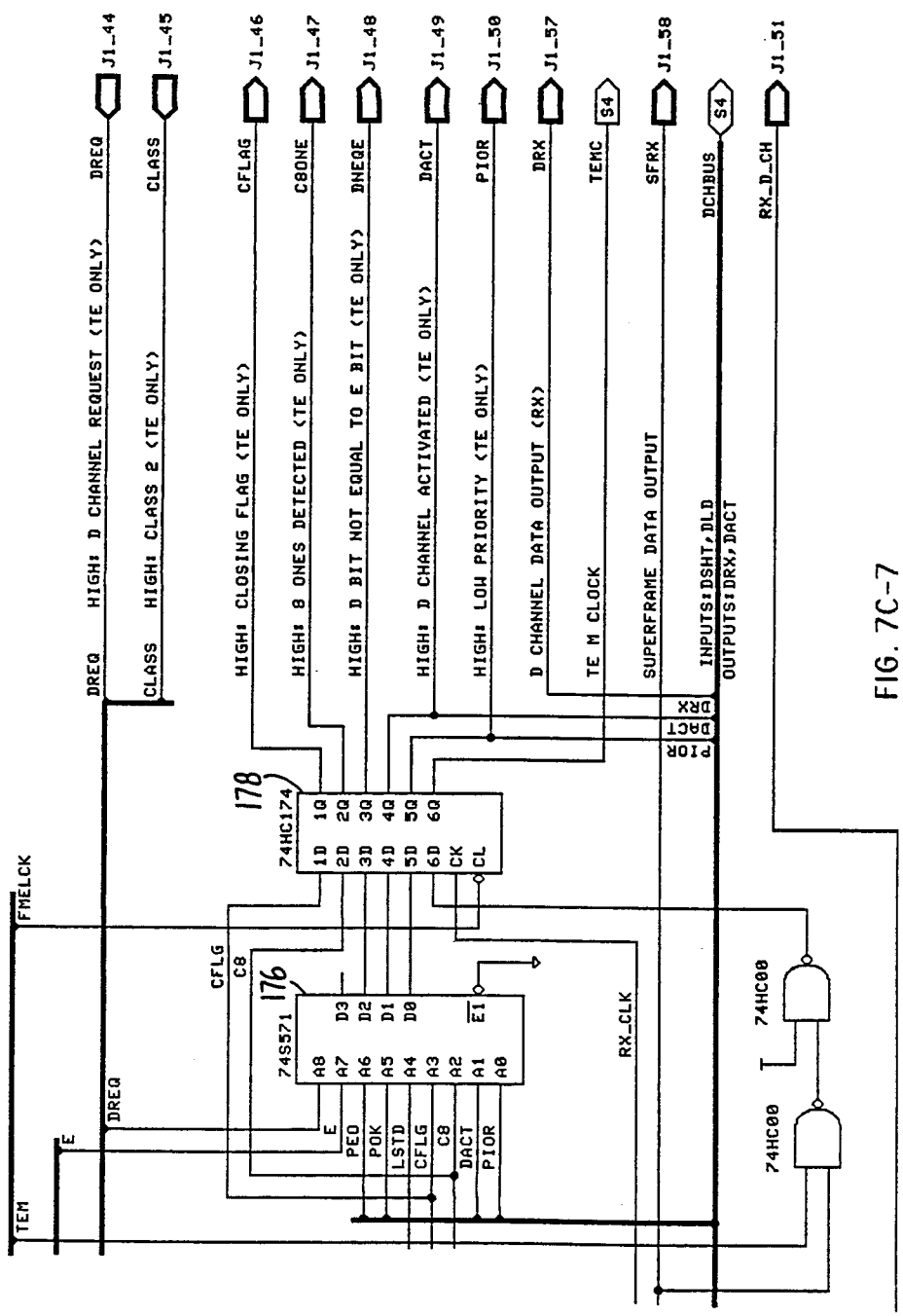

QUOTIENT PHASE-SHIFT PROCESSOR FOR DIGITAL PHASE-LOCKED-LOOPS

MICROFICHE APPENDIX

A microfiche appendix of one microfiche of 31 frames is included as part of this discloser.

COPYRIGHT NOTICE

A portion of the disclosure of this patent document contains unpublished material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

The present invention relates to data transmission systems and, in particular, to a quotient phase-shift processor circuit for realizing phase corrections of a digital phase-locked-loop.

2. Discussion of the Prior Art

A summary of digital phase-locked-loops is provided by William C. Lindsey and Chak Ming Chie in their publication entitled "A Survey of Digital Phase-Locked-Loops", Proceedings of the IEEE, Vol. 69, No. 4, April, 1981.

As stated by Lindsey and Chie, a classical analog phase-locked-loop consists of three primary functional units: a phase detector, a loop filter and a voltage controlled oscillator (VCO). The incoming signal to the phase-locked-loop is mixed with a locally generated sine wave in the phase detector to produce a voltage that is proportional to the instantaneous phase difference between the incoming signal and the local clock. This phase error voltage is filtered and used to control the instantaneous frequency of the VCO. All three components are realized with analog circuitry, e.g., the phase detector is a balanced mixer, the loop filter is an RC low-pass circuit, and the VCO is tuned by adjusting the bias voltage on a Varicap in the tuned circuit which controls the resonant frequency of the VCO.

Continued progress toward increasing performance, speed, reliability, together with the simultaneous reduction in size and cost of integrated circuits has resulted in continuing development of digital phase-locked-loops. In one type of digital phase-locked-loop, the phase detector determines at each cycle whether the input signal phase is early or late. Thus, the sampling phase detector provides a simple binary output which indicates whether the locally generated reference clock leads or lags the input signal. Because of the harsh quantization resulting from this approach, a sequential filter is often used to smooth the correction voltage applied to step the local digital controlled oscillator. The name "sequential filter" implies that the output is not a linear function of a fixed number of inputs. Instead, the sequential filter observes the inputs for a variable duration of time and provides an output when a certain confidence limit on the input is established.

The digital equivalent of the analog integrating element (such as an RC filter) is a digital accumulator. The digital accumulator is mechanized using an adder and a unit delay. By employed two accumulators in tandem, a digital approximation to a double integrator can be obtained. The construction extends, obviously, to higher order approximations.

A digitally controlled oscillator (DCO) is basically a programmable divide by N circuit. The output of a stable oscillator, usually at a frequency M times the IF frequency, where M determines the phase error resolution, is used to drive a counter which increases by one every clock cycle. The content of the counter is compared with the input, and when the two are matched, the comparator provides a pulse which serves as the output of the digitally controlled oscillator and to reset the counter. By varying the control input N, the DCO period can be controlled.

SUMMARY OF THE INVENTION

According to a preferred embodiment of the invention, a quotient phase-shift processor circuit is provided which includes novel techniques for realizing phase corrections of a digital phase-locked-loop. A binary phase-detector of the "early-late" type is combined with range-phase-detect circuitry to generate a variable lock acquisition speed. Phase measure and speed control are performed by incremental manipulation which feeds a novel "quotient" processor. The quotient processor integrates the incremental phase errors and performs phase corrections in a nonperiodic fashion, resulting in lower effective proportional loop gain than that provided in standard phase-locked-loops.

Additionally, wide capture-range and low jitter are obtained by dynamically varying a loop time constant. Pattern dependent noise is reduced by a novel gating technique. High crystal-frequency requirements are reduced, extending the spectral application of digital phase-locked-loops.

The above-mentioned improvements are obtained utilizing low circuit complexity. Only a single crystal external component is required for an integrated implementation.

BRIEF DESCRIPTION OF THE DRAWINGS

FIG. 4A is a table illustrating the quotient algorithm operation of the phase-detector control circuit and the variables involved.

FIG. 4B is a table illustrating a numerical examples of the quotient operation of the phase-detector control circuit.

FIGS. 7A-1 to 7E-3 combine to provide a detailed schematic circuit diagram illustrating a receiver circuit which uses a quotient algorithm digital-phase-locked-loop utilized in accordance with the present invention.

DETAILED DESCRIPTION OF THE INVENTION

Typical data signals modulated in baseband contain some characteristic that transports the timing inband. This characteristic is known as the "timing-signal". "Timing-recovery" techniques use a "timing-extractor" TEX circuit to retrieve the timing-signal from the data signal. Typically this takes the form of a sequence of strobes with a rate related to the data rate $f_b$.

The timing-extractor circuit typically performs a squaring or other non-linear function and includes some noise filtering. The resulting signal is synchronized through a frequency/phase-controlled-clock in a phase-locked-loop (PLL) arrangement. A synchronizer block diagram is shown in FIG. 1, with corresponding PLL waveforms shown in FIG. 2.

Figure 3A:
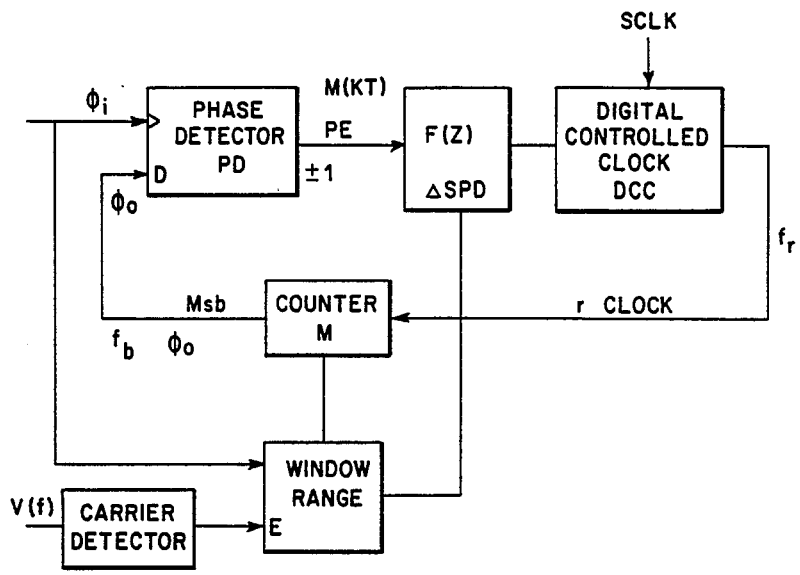
FIG. 3A is a schematic block diagram illustrating a simple, first-order model of the synchronizer shown in FIG. 1.

The synchronizer described herein utilizes a digital phase-locked-loop, a simple model for which is shown in FIG. 3A. A first-order loop is controlled by a proportional-gain. "F(Z)" identifies the loop-filter and "M" identifies a loop frequency-divider. The box labelled "Window Range" in FIG. 3A varies the loop constant, as will be explained in greater detail below.

Figure 1:
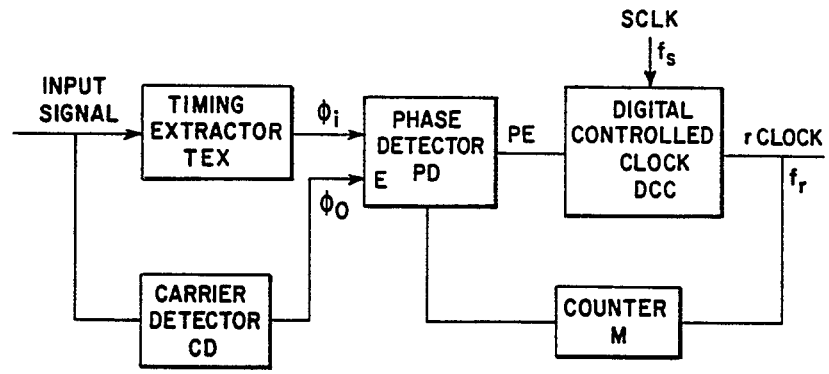
FIG. 1 is a schematic block diagram illustrating a synchronizer utilized in accordance with the present invention.

The synchronizer shown in FIG. 1 includes a binary phase-detector PD. The phase-error PE bit sequence is processed by a controller to obtain phase-manipulation of the digital-controlled-clock DCC to result in a phase transition to advance or retard the clock time.

The system shown in FIG. 1, and in greater detail in FIGS. 7A-7E, is capable of reducing the available proportional-gain for a given SCLK-to-data-rate ratio. This reduction is obtained by performing phase-shift-correction in a "nonperiodic fashion", as opposed to conventional techniques which correct at periodic positions. Alternatively, a given proportional-gain requires a lower crystal clock rate for implementation.

Another advantage of the present invention is its ability to disable phase correction when no timing information is available, thereby reducing pattern-dependent jitter.

Figure 3B:
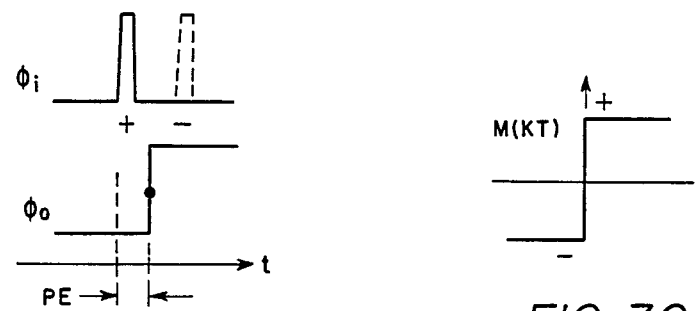
FIG. 3B is a timing diagram illustrating the signal transistions of the synchronizer shown in FIG. 3A.
Figure 3C:
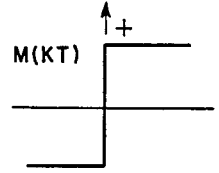
FIG. 3C is a timing diagram illustrating the phase relationship between the signals of the synchronizer shown in FIG. 3A.

Referring to FIGS. 3A-3C, the phase-detector PD compares the phase-relation from the digital-controlled-clock DCC to the timing-signal edge every data period $1/f_b$. This results in a phase-error PE. The output of the digital-controlled-clock DCC, identified as the received clock signal "rclock" in FIG. 3A, has its frequency reduced by a counter M to obtain the baud-clock BDCC. Thus, the binary phase-detector PD generates the error signal, indicating whether the edge of the baud clock BDCC is early or late with respect to the incoming "timing-signal".

The transfer characteristics of the binary phase-detector PD are illustrated in FIG. 3C as $m(k1/f_b)$ vs. phase-error PE.

In a phase-locked-loop with a fully proportional detector, the correction "size" is proportional to error magnitude and the step size is self-regulating in the loop. For a binary phase-detector, error "size" is immaterial and only sign is accounted for.

A controlled-clock includes a demodulator which performs an integration to obtain the controlled variable, phase in this case, without effecting the order of the loop.

Phase correction is typically performed in a periodic fashion at a rate which is a fraction of the master clock SCLK.

On baseband transceivers, a timing-extractor TEX generates nonperiodic strobes. A gating technique is required to avoid miscorrection to the digital-controlled-clock DCC during lack of strobe periods. In the present system, the phase-detector circuitry includes a "strobe-presence" monitor which guarantees one correction per strobe and avoids correction for the lack-of-strobe condition. The digital-controlled-clock DCC circuit is capable of placing the correction at a nonperiodic rate, as explained in greater detail below.

Control commands are issued to the digital-controlled-clock DCC at every strobe by two binary signals. A phase-detector signal indicates direction of correction and a "hold-go" signal defines strobe presence.

As shown in FIG. 3A, the front-end of the digital-controlled-clock DCC receives a sequence of phase error PE bits and integrates them to determine when to effect the phase-manipulation step. This produces instantaneous, impulsive frequency changes.

Conventional digital-phase-locked-loops have a fixed time-point, or epoch, to apply a step size of either one or a multiple of the SCLK periods.

The first-order PLL capture range is given by +/− of the inverse of proportional gain PG, where proportional gain PG is the ratio of effected corrections to the total number of possible corrections made.

The nonperiodic corrections of the quotient PLL of the present invention stretch the "number of possible corrections to actual corrections" ratio, resulting in fractional proportional gains (i.e. <1). Small fractional corrections are accumulated over several correction periods. The digital-controlled-clock operates on a "quotient" basis at the baud-rate.

Assume a processor that solves for the following quotient $Q_i$, where $$A_i/K = Q_i + R_i/K \qquad (1)$$

A graphic representation of the quotient algorithm is provided in FIG. 4A; FIG. 4B provides a numerical example, where K=15 and $D_a$=12.

Figure 5:
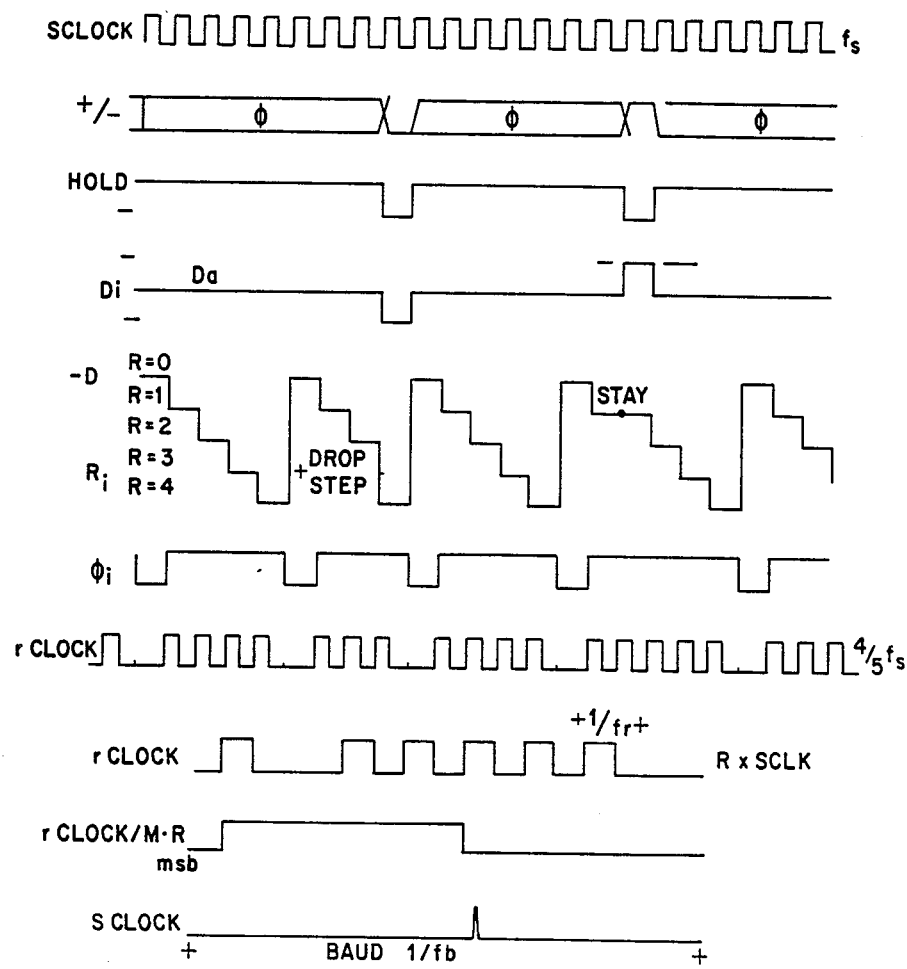
FIG. 5 is a timing diagram illustrating the relationship between the signals of the synchronizer shown in FIG. 1.

Every crystal-clock period, a sequential accumulator "$A_i$" is divided by a divisor constant "K" (called modulous) resulting in a quotient $Q_i$, which may be only 1 or 0, and a remainder $R_i$. At the beginning of the next cycle, the value $R_i$−1 is added to a "delta $D_i$" and the operation is repeated. For incremental phase control, this is done by fluctuating the $D_i$ value ±1 around a constant $D_a$, as shown in FIG. 5. The waveform $Q_i$ displays a sequence of "1" values followed by the appearance of a "0", with patterns depending on the phase error history sequence. The rate of zeroes in the waveform $Q_i$ is determined by the divisor constant K and by the size of $D_i$ and is evident by the patterns created in the $R_i$ and $A_i$ waveform, as further shown in FIG. 5. The remainder $R_i$ has a memory effect which slowly fades its value, keeping the quotient $Q_i$ at 1. When the remainder is exhausted, a "0" $Q_i$ appears.

An incremental (±step) phase is effected by issuing a ±1 increment on the constant $D_a$ at the given baud time (i). Patterns on the $A_i$ waveform are extended, or shortened, with corresponding effect in the quotient $Q_i$, and either stop or accelerate a further change of phase. The "rclock" output is obtained by gating the crystal-clock with the quotient $Q_i$ signal. The rclock frequency is further divided down to the baud-frequency to feed the phase-detector PD. For steady-state frequency-division, $D_i$ is maintained at the value $D_a$.

Absolute phase is obtained after an accumulation of past ±inputs. The rclock output is shown in FIG. 5, where K=15 and $D_a$=12, and the ratio of baud-frequency to the crystal clock-frequency is given by the factor M=40. The quotient-factor R is equal to $D_a/K$ or, in the example, 12/15.

The system parameters are related by the following expressions:

$$D_i = D_a \pm [1,0] \quad (2)$$

$$R_i MAX = K - 1 \quad (3)$$

The proportional phase to manipulation signal is provided by $$P = \left[ K^*D_a - \sum_{t=1}^{m} D_i \right] / K \quad (4)$$

$$R = D_a/K \quad (5)$$

In the conventional digital phase-locked-loop, for a ratio of crystal-clock rate to baud rate, the proportional-gain is 1/M. For the quotient phase-locked-loop approach of the present invention, the following relationship is obtained:

$$[1/M]^* R^* 1/D_a. \quad (6)$$

Step size applied for correction determines the loop time-constant. A speed circuit that varies proportional gain PG depending on circuit conditions is described below.

Figure 6A:
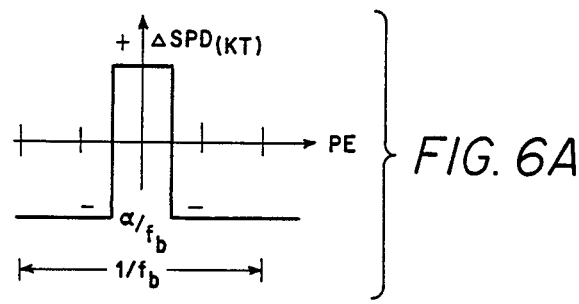
FIG. 6A is a graph illustrating the transfer characteristics of the range-phase-detector utilized in the synchronizer shown in FIG. 1.

Digital phase-locked-loops typically have the problem that the loop proportional gain PG determines the phase control resolution and capture dynamics, i.e., capture-range and lock-time. An approach that avoids this disadvantage makes use of a second digital phase-detector called a range-phase-detector RPD. The range-phase-detector RPD resolves whether the digital-controlled-clock DCC phase is "in" or "out" of a range, as shown in FIG. 6A. Gear-shifting is used to effect eventual larger correction steps. The range-phase-detector RPD decision dynamically changes the number of consecutive corrections made per strobe, thus modifying the capture speed and range, as shown in FIG. 6B.

The "phase-range" is defined as a sector of finite phase-width around a desired range to determine the in or out of range of the phase error PE. The range-phase-detector RPD has a binary output indicating the in or out of range of the digital-controlled-clock DCC phase with respect to the incoming strobe.

Speed modulation in the quotient phase-locked-loop of the present invention effectively changes the slope of the phase-versus-time response of the capture-process.

Figure 6B:
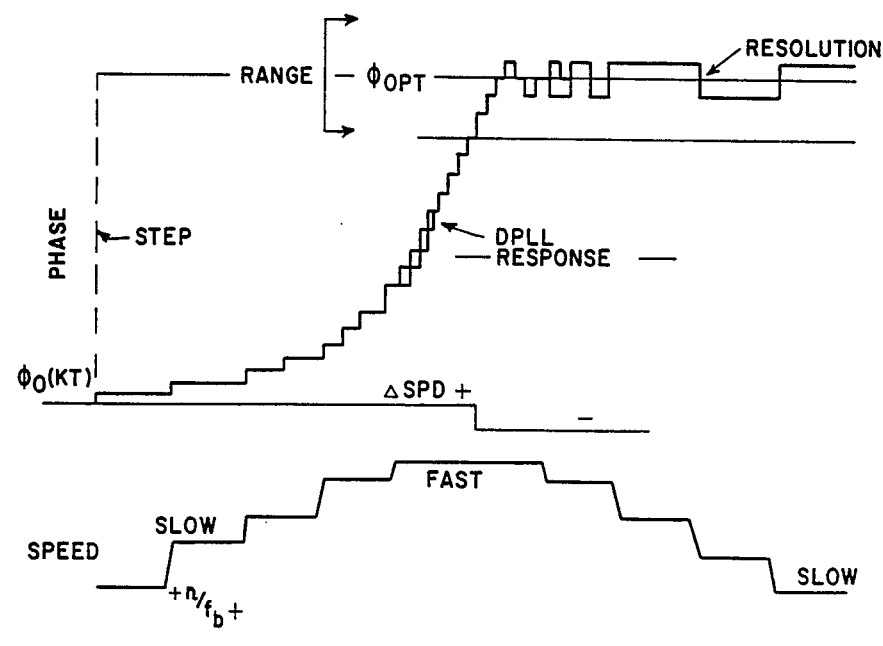
FIG. 6B is a graph illustrating the capture process of the range-phase-detector utilized in the synchronizer shown in FIG. 1.

Incremental range-phase-detector RPD output is accumulated in a top and bottom saturated integrator which determines the current operating speed, as shown in FIG. 6B.

Another vital issue to be considered in the application of the present invention is the reduction of pattern noise by gating off the incremental phase error PE.

When a carrier is absent for a time-out value TO, the speed-integrator drifts to the fast-mode. For some applications, it is more robust to maintain the current speed for the time-out value TO, i.e. acceptable carrier missed time. If TO is reached, the system is returned to fast-access mode. The input signal is processed by a data-detect circuit that enables control circuit operation, as illustrated in FIG. 3A.

An adaptive equalizer controller/PLL timing recovery/data sampler circuit which utilizes the quotient digital-phase-locked-loop concepts of the present invention is shown schematically in FIGS. 7A-7E.

Figures 1, 7A:
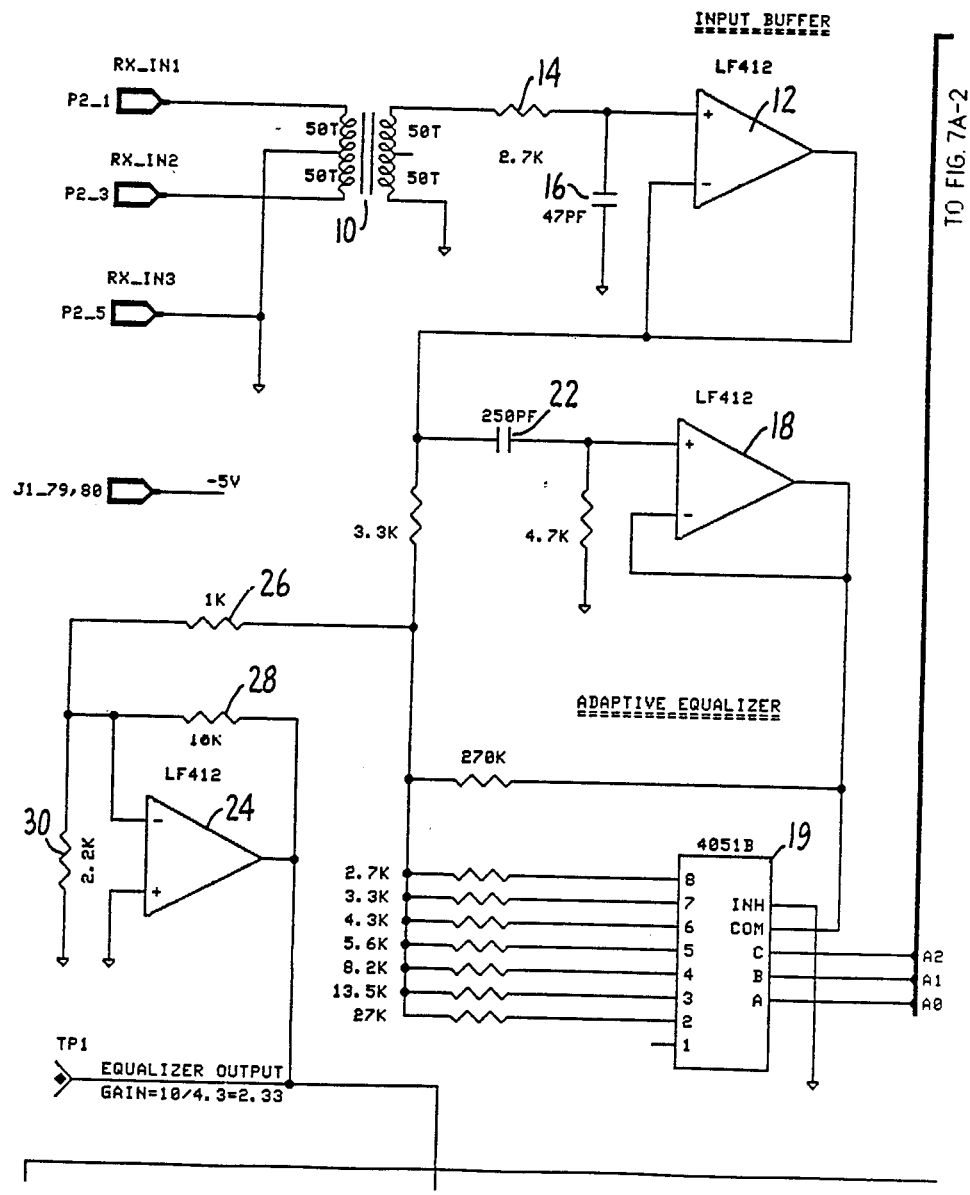
Figures 2, 7A:
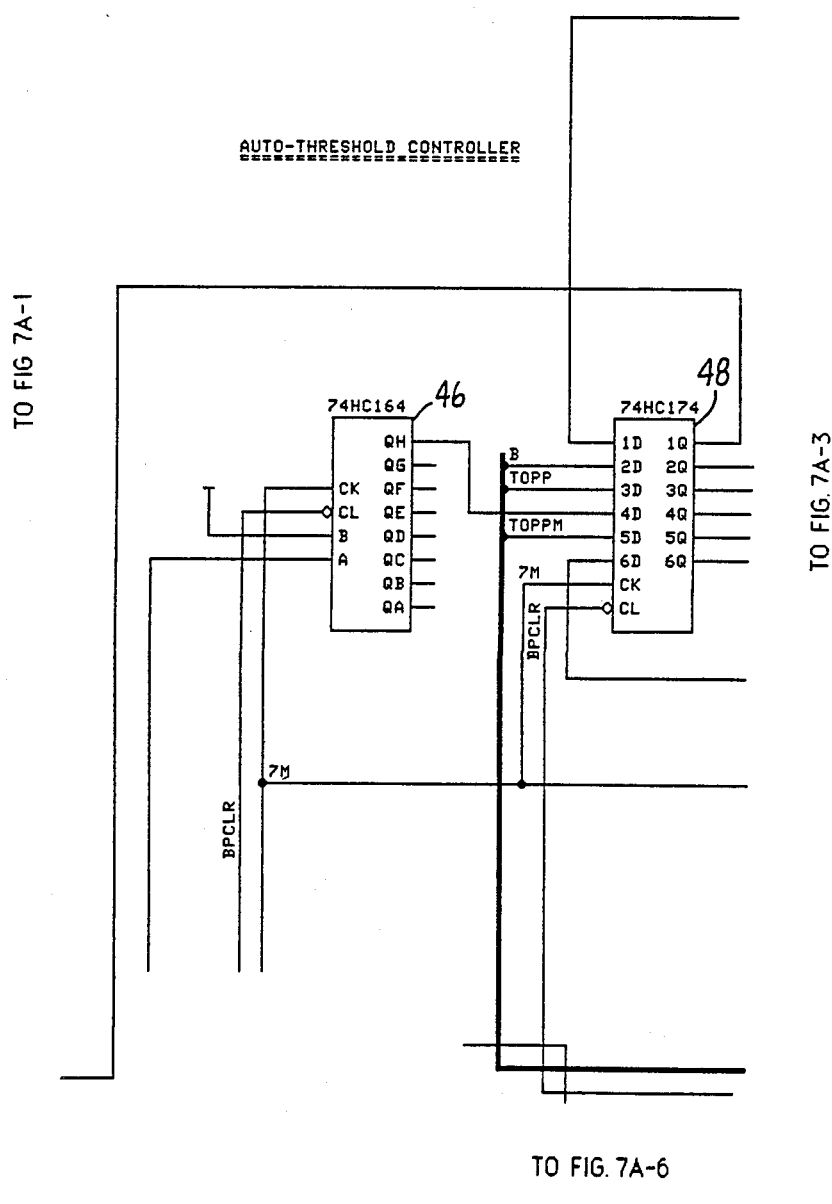

As shown in FIG. 7A, the circuit includes a receiver front end and adaptive equalizer which includes an input transformer 10 with a 1:1 ratio to prevent overloading of the buffers and the equalizer. The output of the transformer 10 is provided as one of the inputs to a unity gain buffer and low-pass filter consisting of buffer 12, 2.7K resistor 14 and 47 pF capacitor 16 and having a −3 dB roll-off at a frequency of 1.25 MHz. The output of the unity gain buffer is provided to a line equalization high-pass filter which consists of buffer 18 and an input RC consisting of 4.7K resistor 20 and 250 pF capacitor 22. The high-pass filter has a −3 dB roll-off at a frequency of 135 KHz. An amplifier 24, together with 1K resistor 26, 10K resistor 28, and 2.2K resistor 30, combine to form an inverting/summing amplifier which generates the equalizer output with a gain of 2.33. The amount of equalization is controlled by binary code at pins C (msb), B and A of component 19 and it's seven associated resistors. Thus, there are eight possible steps, with a "0" binary code equalling a flat response.

The equalizer output signal from component 24 is provided to a group of input slicers and level translators (see FIG. 7A-5). Components 32 and 34, together with an auto-threshold controller, which is described in detail below, form a full-wave, peak-voltage tracking loop. The voltage reading $V_{ath}+$ at the positive input of component 34 is a measure of the peak voltage of the equalizer output, i.e. 0.5 volts denotes the output amplitude=0.5 V peak or IV peak-to-peak. If the output amplitude is below 0.22 or above 2.33 V, then $V_{ath}+$ will be limited to 0.22 or 2.33 V, respectively. This is accomplished by the resistor "T" network at the positive input of component 36.

If voltage $V_{ath}+$ is normalized to 1, then the voltage $V_{ath}-$ at the negative input of auto-threshold 0-comparator 32 is −1 V, the voltage V0+ at the negative input of 0+ signal-detection slicer 38 is 0.5 V, and the voltage V0− at the negative input of 0- signal-detection slicer 40 is −0.5 V.

If voltage $V_{ath}+$ exceeds 1280 mv, then V0+ and V0− are clamped to 640 millivolts and −640 millivolts, respectively. The clamping function is necessary when the circuit operates in the network terminating mode with multiple-terminal nodes TE connected to the bus. Otherwise the nearby TEs would drive the V0+ or the V0− threshold levels above the received signal peaks from the remote TEs, causing detection errors.

The PNP transistor 42 connected to the negative input pin of component 38 provides the clamping function.

A cross-reference table showing the relationship between the voltage levels is provided in Table 1 below.

TABLE 1

| X' Former | Secondary | $E_q$ O/P | $V_{ath+}$ | VO+ |
|---|---|---|---|---|
| 1 $V_{peak}$ | (+2.5 dB) | 2.33 $V_{peak}$ | 2.33 V | 0.64 V |
| 0.89 $V_{peak}$ | (+1.5 dB) | 2.07 $V_{peak}$ | 2.07 V | 0.64 V |
| 0.75 $V_{peak}$ | (0 dB) | 1.74 $V_{peak}$ | 1.74 V | 0.64 V |
| 0.55 $V_{peak}$ | (−2.7 dB) | 1.28 $V_{peak}$ | 1.28 V | 0.64 V |
| 0.50 $V_{peak}$ | (−3.5 dB) | 1.17 $V_{peak}$ | 1.17 V | 0.58 V |
| 0.32 $V_{peak}$ | (−7.5 dB) | 0.74 $V_{peak}$ | 0.74 V | 0.37 V |
| 0.09 $V_{peak}$ | (−18.0 dB) | 0.22 $V_{peak}$ | 0.22 V | 0.11 V |
| 0 $V_{peak}$ |  | 0 $V_{peak}$ | 0.22 V | 0.11 V |

Note: $V_{ath-} = -V_{ath+}$, VO− = −VO+.

The output of auto-threshold comparators 32 and 34 is provided to an auto-threshold controller. More specifically, the output of auto-threshold comparator 34 is provided through XOR gate 44 and pipelined through components 46 and 48 (see FIG. 7A-2), its destination being auto-threshold controller ROM 50 (see FIG. 7A-3). The coding program "ATHCTL.src" for auto-threshold controller ROM 50 is provided the microfiche appendix.

The signal at pin A3 of ROM 50 is named "TOPP", and, if high, shows the 0+ pulse from the equalizer is either higher than $V_{ath+}$ or the 0− pulse is lower than $V_{ath-}$ (0+ and 0− pulses are exclusive). The TOPP signal is used to generate the error feedback control for the loop. Under normal operation, the control loop will "track out" the voltage differences causing TOPP to bounce between 0 V and 5 V.

Figures 3, 7A:
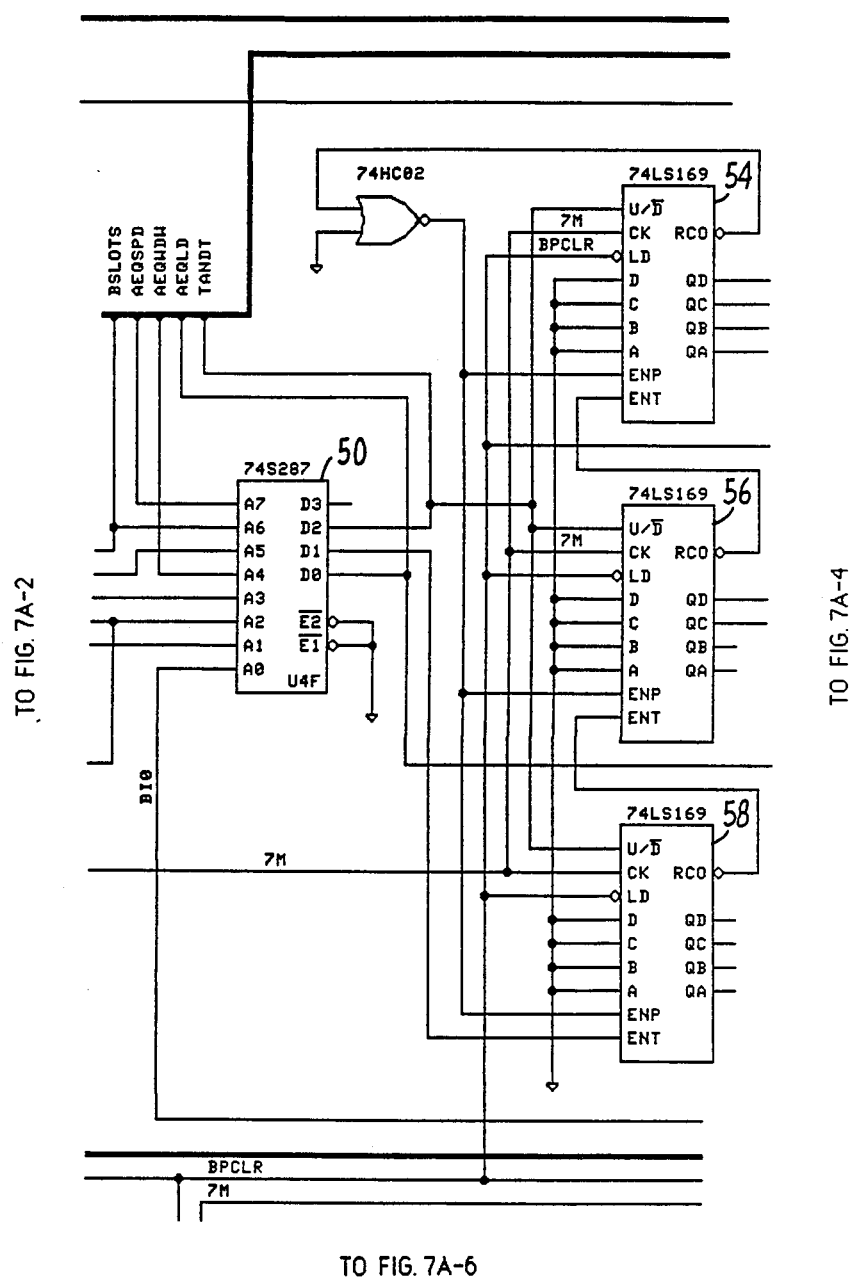
Figures 4, 7A:
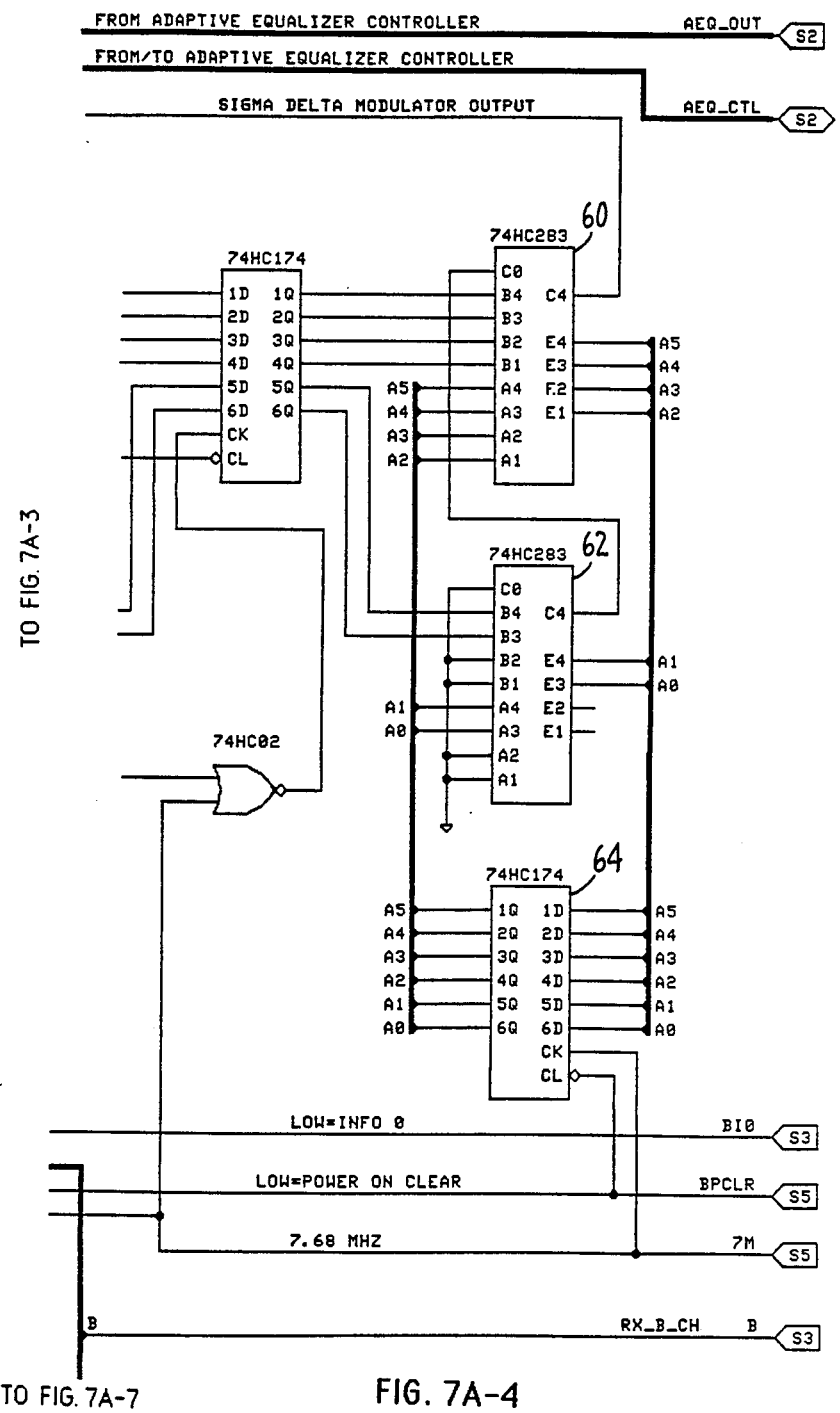
Figures 5, 7A:
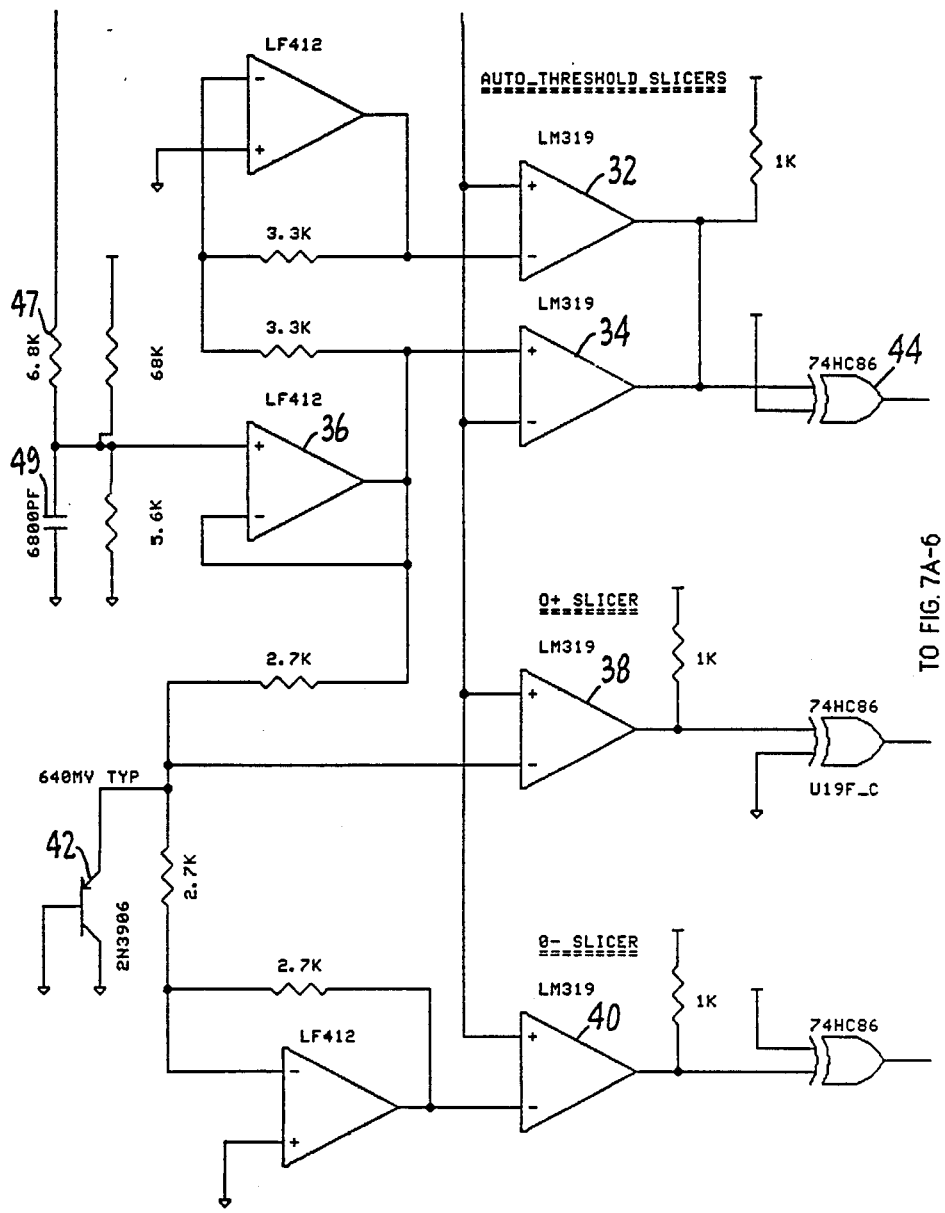

There are three qualifiers connected to auto-threshold controller ROM 50. The first qualifier is provided by center estimating ROM 52 (see FIG. 7A-7) and is the sliced output from the 0+ and 0− filters. This signal named "TOPPM", top positive and minus, if high, indicates that the TOPP output is due to a "healthy" pulse, i.e., one not caused by noise. The TOPPM signal also indicates when the input signal has no modulation, i.e. binary 1's imbedded in the input stream. In this case, $V_{ath+}$, as well as $V_{ath-}$, retain the previous value during the binary 1's period, resulting in less ripple in the control voltage.

The second qualifier input to ROM 50 is provided by the adaptive equalizer and is identified as "AEQWDW". This qualifier allows the auto-threshold circuit to operate on the same input signal segments as the adaptive equalizer.

The third input to ROM 50 is from the frame synchronizer/lock detector, to be described below, and is identified as "BSLOTS". This signal enables the auto-threshold circuit from the second "B" bit to the bit after the last "B" bit in the B1 and B2 channels. The function of the BSLOTS input is to prevent the auto-threshold circuit from responding to other bits which may contain distortion due to bus contention.

The signal "AEQSPD", applied to pin A7 of ROM 50, is derived from the frame synchronizer/lock detector, which is set high after frame-in-lock plus eight additional frames, and is used to enable/disable the qualifiers. When AEQSPD is set low, the TOPP output is qualified with TOPPM only, so that $V_{ath+}$ or $V_{ath-}$ ramps up at maximum speed. After signal AEQSPD is set high, TOPP is qualified with TOPPM, AEQWDW and BSLOTS, so that the activities of the auto-threshold circuit are limited to a fraction of a bit period within the B channels for rejecting unwanted input imperfections.

Components 54, 56 and 58 (see FIG. 7A-3) form an error integrator for the control loop. The error integrator, up/down controlled by the TOPP signal, is enabled during the period defined by the qualifiers. During the window openings, the integrator counters either count up if the input signal is less than $V_{ath+}$ or count down if the input signal is more than $V_{ath+}$. The opposite is true for $V_{ath-}$.

The signal TOPP, which is applied at pin D3 of ROM 50 and derived from the center estimating ROM 52, is the sliced 0+ filter output. This signal is similar to TOPPM except that there is no output for the 0− input pulses. During the rising edge of the TOPP signal, the integrator's output is transferred to a Sigma/Delta modulator, described below.

The Sigma/Delta modulator, consisting of components 60, 62 and 64 (see FIG. 7A-4), converts the binary output from the integrators 54, 56 and 58 to a 1 bit pulse density modulated PDM signal having a 7.68 MHz sampling frequency. The modulator is functionally equivalent to a conventional 6 bit digital-to-analog converter (DAC). The output of the modulator is available at the "carry" pin, i.e. pin C4, of adder circuit 60. The output is then pipelined through component 48 (pin 1D) and converted into a DC control voltage after the RC "T" network consisting of 6.8K resistor 47 and 6800 pF capacitor 49, connected at pin 1Q of component 48. The RC time constant is set at 20 microseconds, which is about 4 bit periods.

Signal "BIO", which is derived from "info decoders", to be described in greater detail below, goes low when the input equals INFO 0. If INFO 0 is detected, then $V_{ath+}$ (the same for $V_{ath-}$, but opposite direction) is ramped down towards the minimum voltage level, i.e. the highest sensitivity.

Figures 6, 7A:
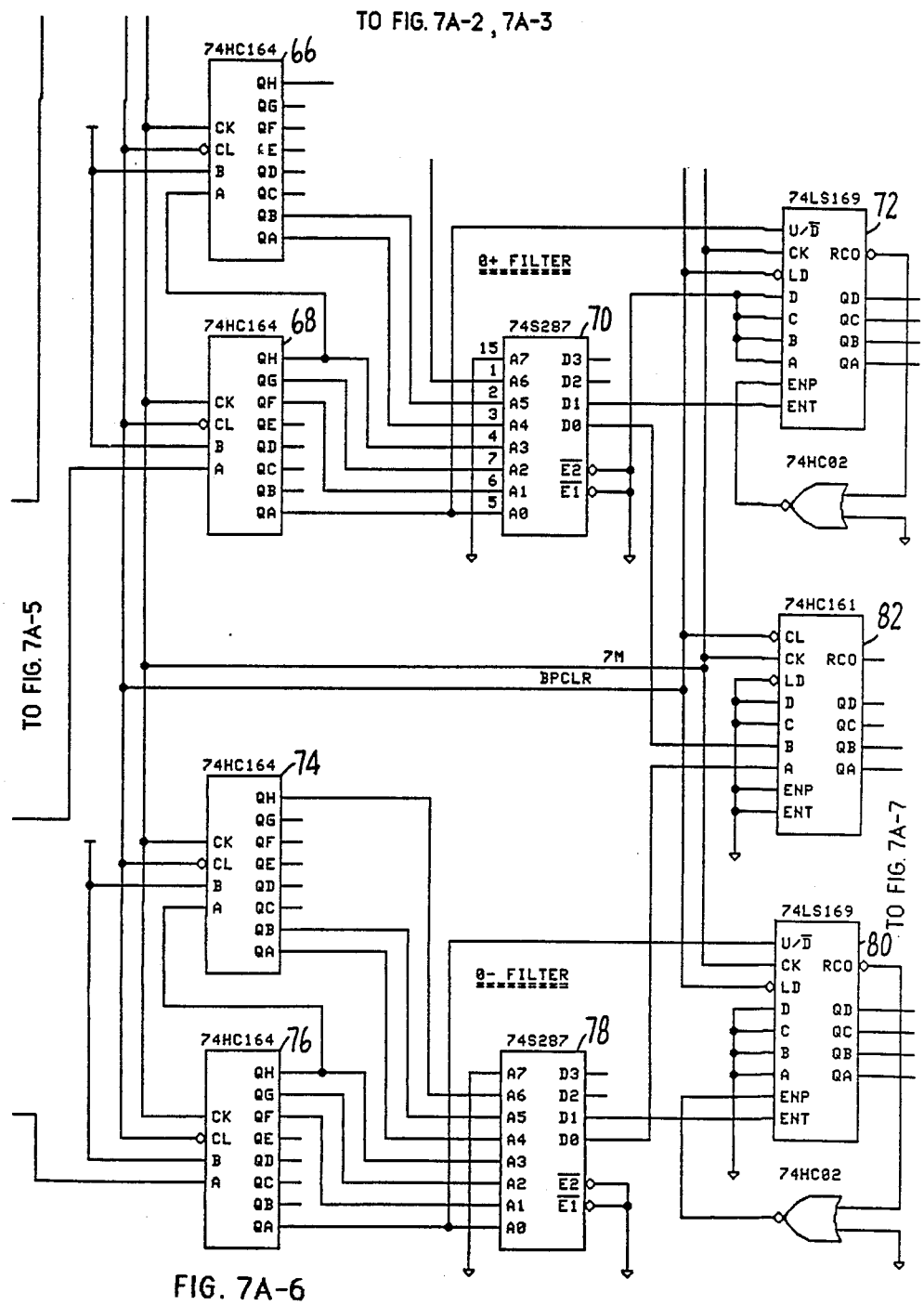
Figures 7, 7A:
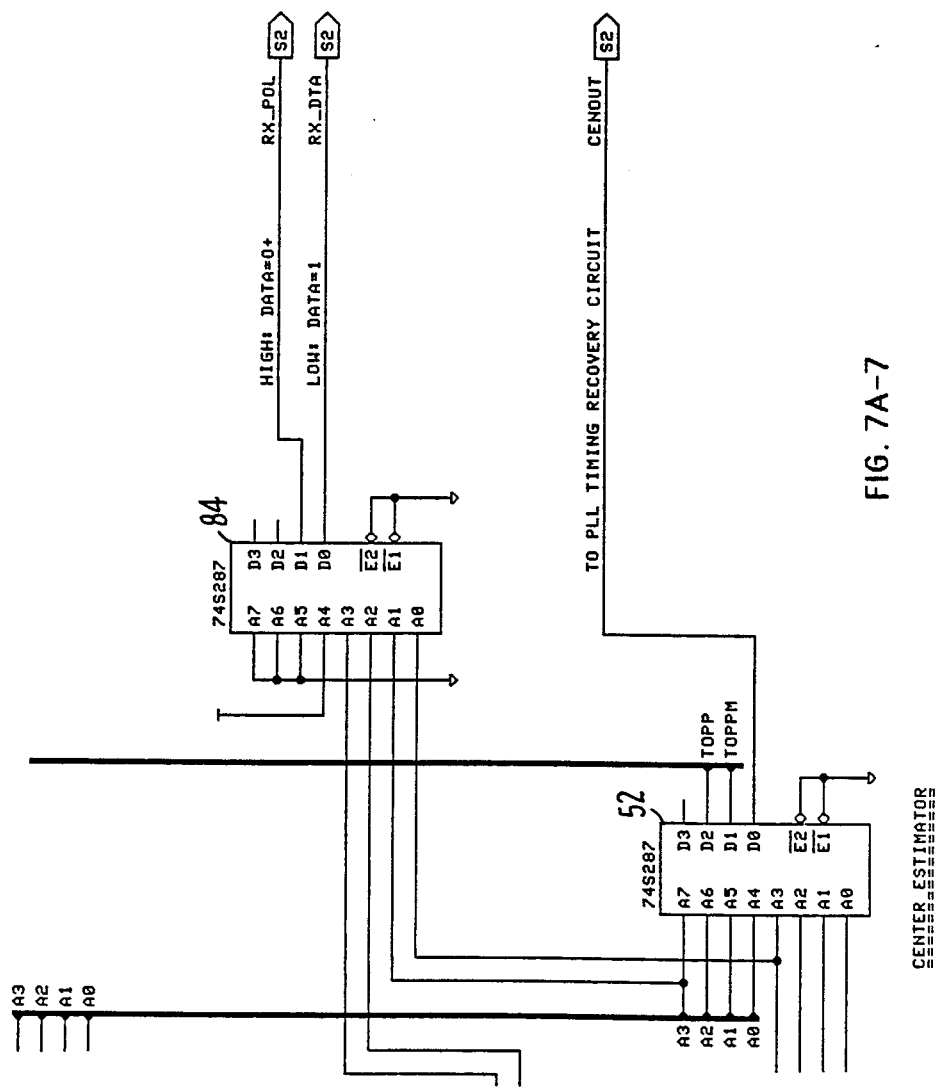

As shown in FIG. 7A-6, the 0+ filter block, consisting of components 66, 68, 70 and 72, and the 0− filter block, consisting of components 74, 76, 78 and 80, are identical. Each filter block consists of two 1-bit wide moving average filters (5 and 15 sampling points), so there are four filters. The filter algorithm sums the numbers of 1's and 0's within the specified window period. If the number of 1's is greater than the number of 0's, then the filter outputs a "1". If the opposite is true, then the filter outputs a "0". Details of the coding algorithm "FTF" are provided in the microfiche appendix. The implementation of the 15-point filters is slightly different from the 5-point filters, in that the 15-point filters utilize counters instead of direct decoding for cost purposes.

The 5-point filters are utilized for signal detection, i.e., demodulation, purposes. The 0+ filter output is available at pin D0 of component 70, while the 0− output is available at pin D0 of component 78. These two outputs, after being pipelined through component 82, are provided to PROM 84 (see FIG. 7A-7). PROM 84 also receives inputs from the 15-point outputs of filters 72 and 80. The select pin, i.e., pin A4 of PROM 84, selects either the 5-point pair or the 15-point pair to the outputs of PROM 84. In the illustrated embodiment, the select input is connected to $V_{CC}$ such that the 5-point filter outputs are always selected. The "RX-POL" output from PROM 84 is identical to the 5-point 0+ filter output: if high, input=0+; if low, input=0−. The "RX-DATA" output is the logical "OR" of the 5-point 0+ and 0− filter outputs: if high, input equals 0+ or 0−; if low, input equal binary 1. The coding program "FASEL" for the PROM 84 is provided in the microfiche appendix.

The 15-point filters serve as the front-end circuitry for the center estimator described below. The TOPP and TOPPM signals connected to the auto-thresholder section described above are derived from the 0+ and the 0− filters: if the number of 1's is ≧12 within a 15-point window, then the output is set to 1.

As described above, a front-end set of comparators slice the signal at thresholds determined by a peak detector circuit, typically at one-half of the received signal peak. The system is sampled at a rate $f_s$, typically many times the line-rate $f_b$. Asynchronous polar pulses P and N are fed with proper phase to the filter circuits using shift registers 66, 68 and 74, 76, respectively. Integration is performed by up-down counters 72 and 80 which are connected in a top/bottom self-stop mode. Circuits 70 and 78 produce integrator control signals based in pulse presence for a time span given by the register length. Center estimator ROM 52 contains discrimination logic plus detector circuitry. As stated above, state transition is provided by the FASEL program listing provided in the microfiche appendix.

The center estimator described above is described in greater detail in copending U.S. patent application Ser. No. 108,717, filed by Wong Hee and Jesus Guinea of even date and commonly assigned herewith.

Figures 1, 7B:
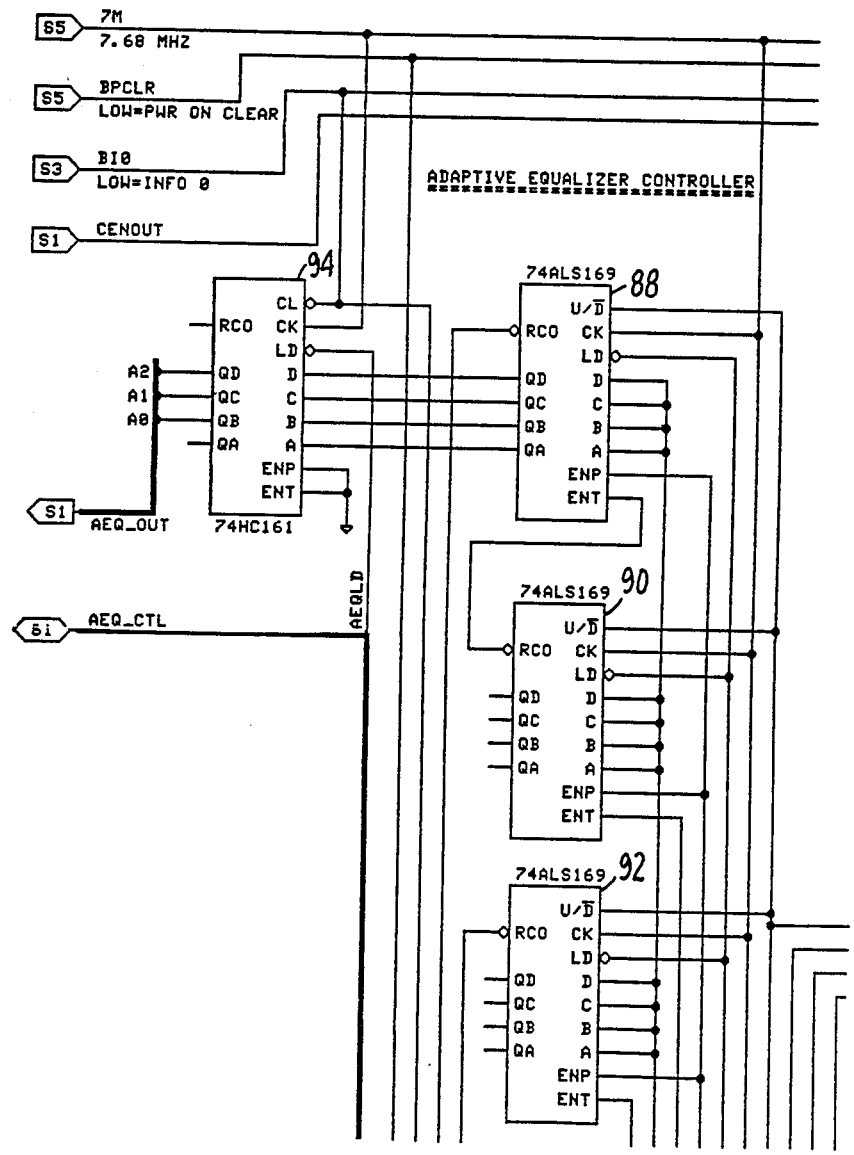
Figures 2, 7B:
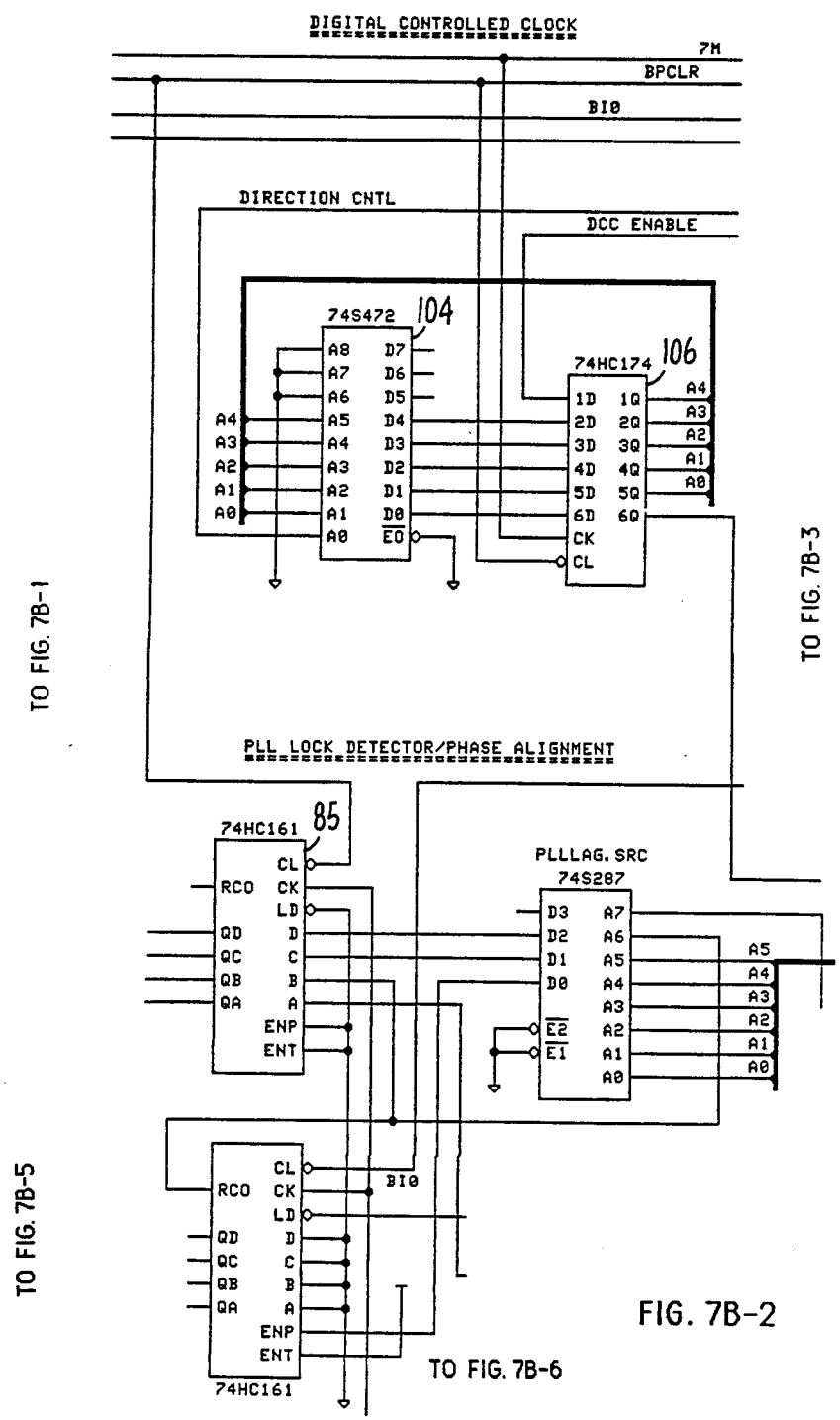
Figures 3, 7B:
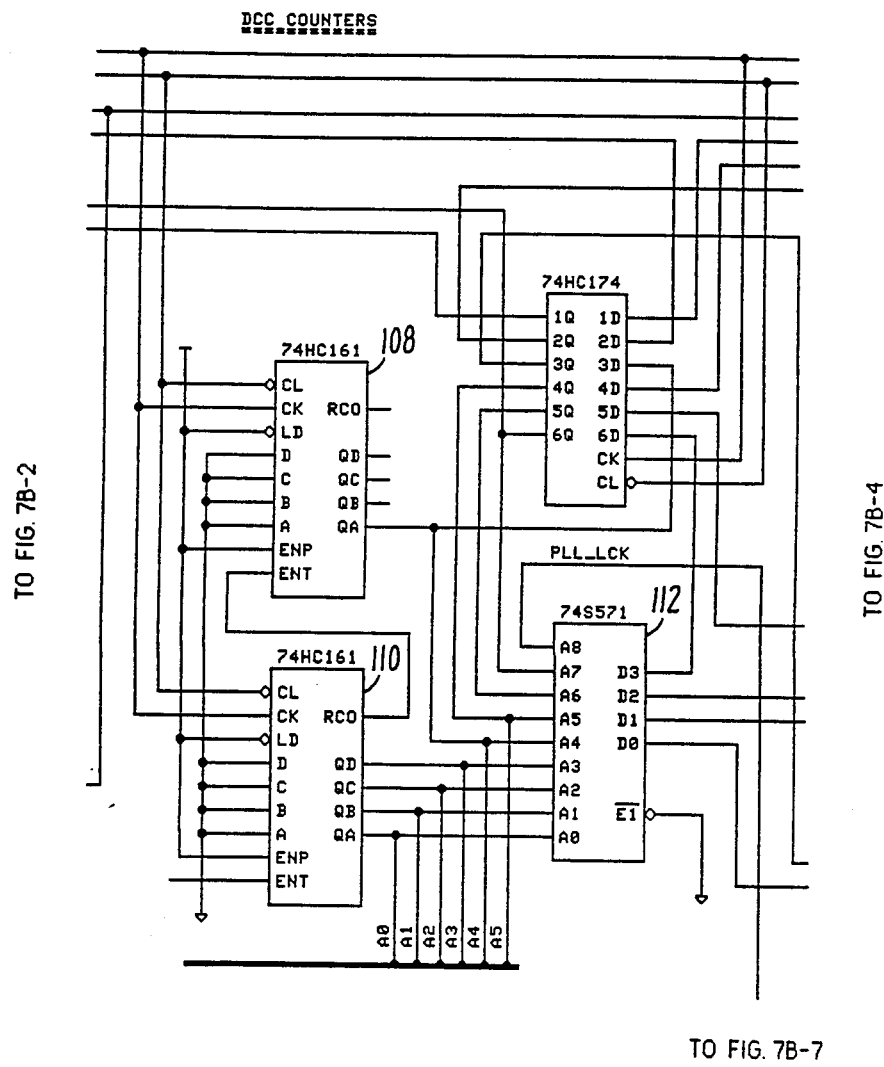
Figures 4, 7B:
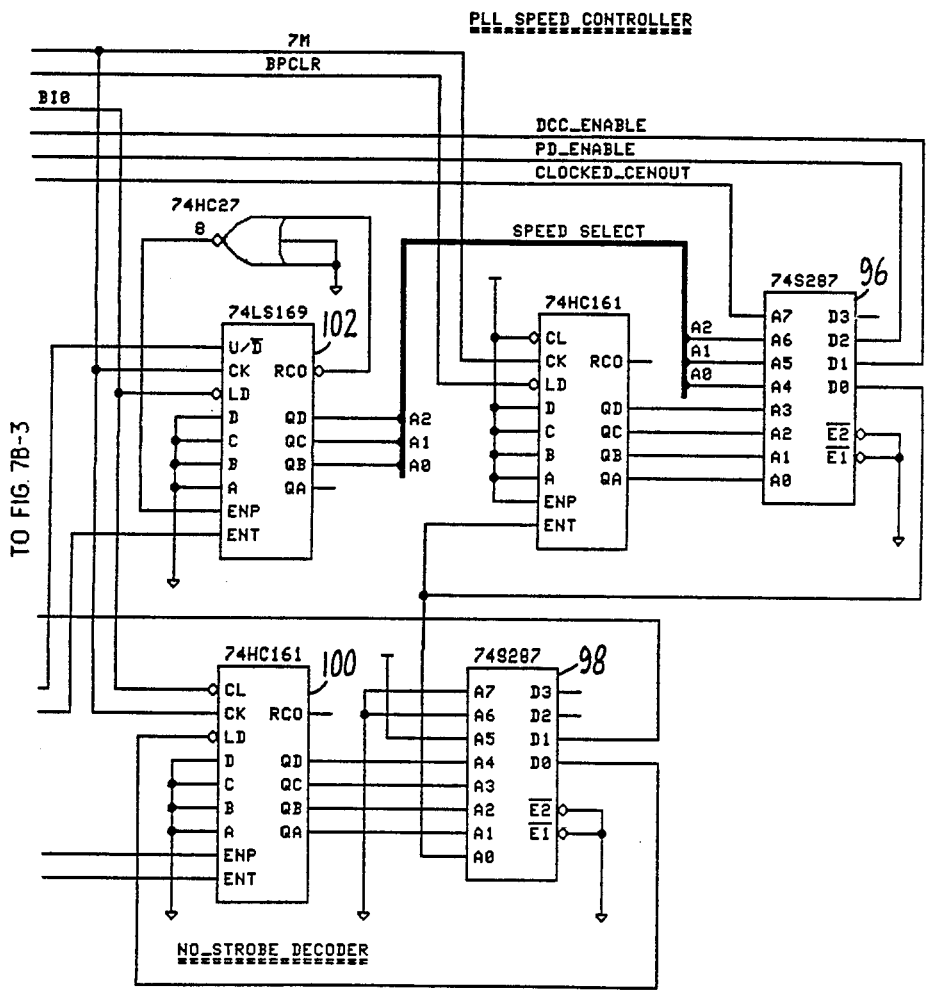
Figures 5, 7B:
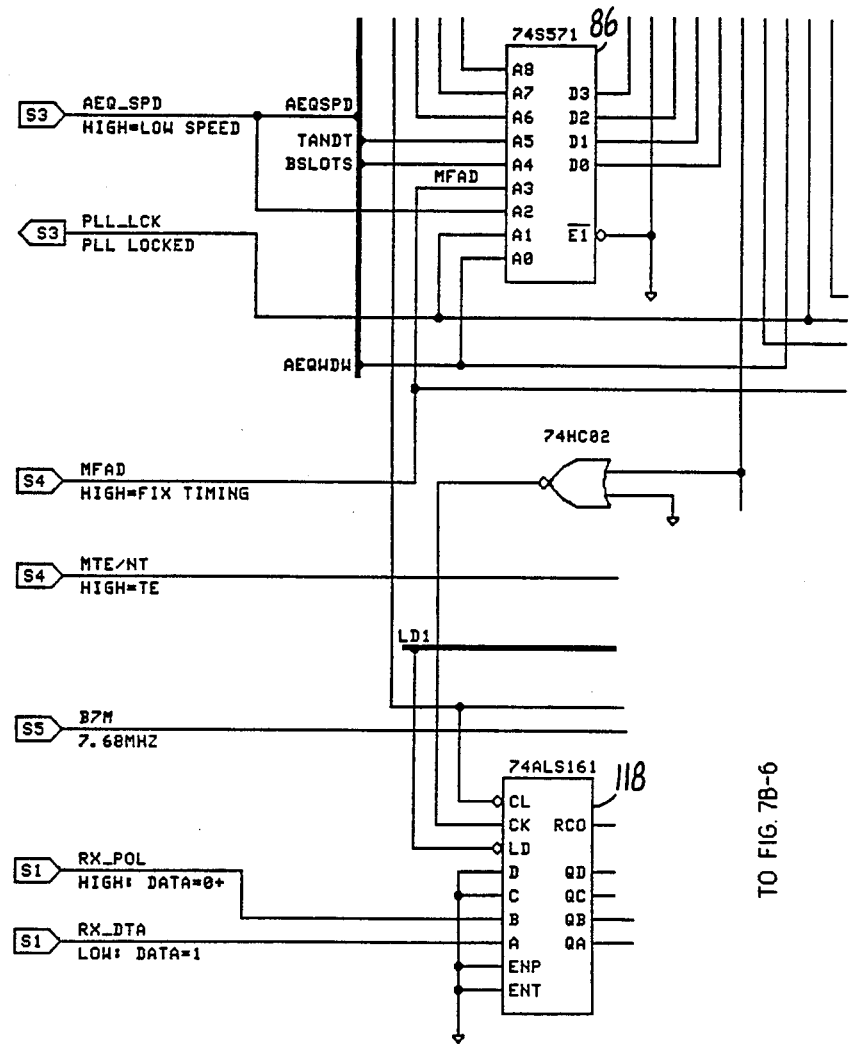
Figures 6, 7B:
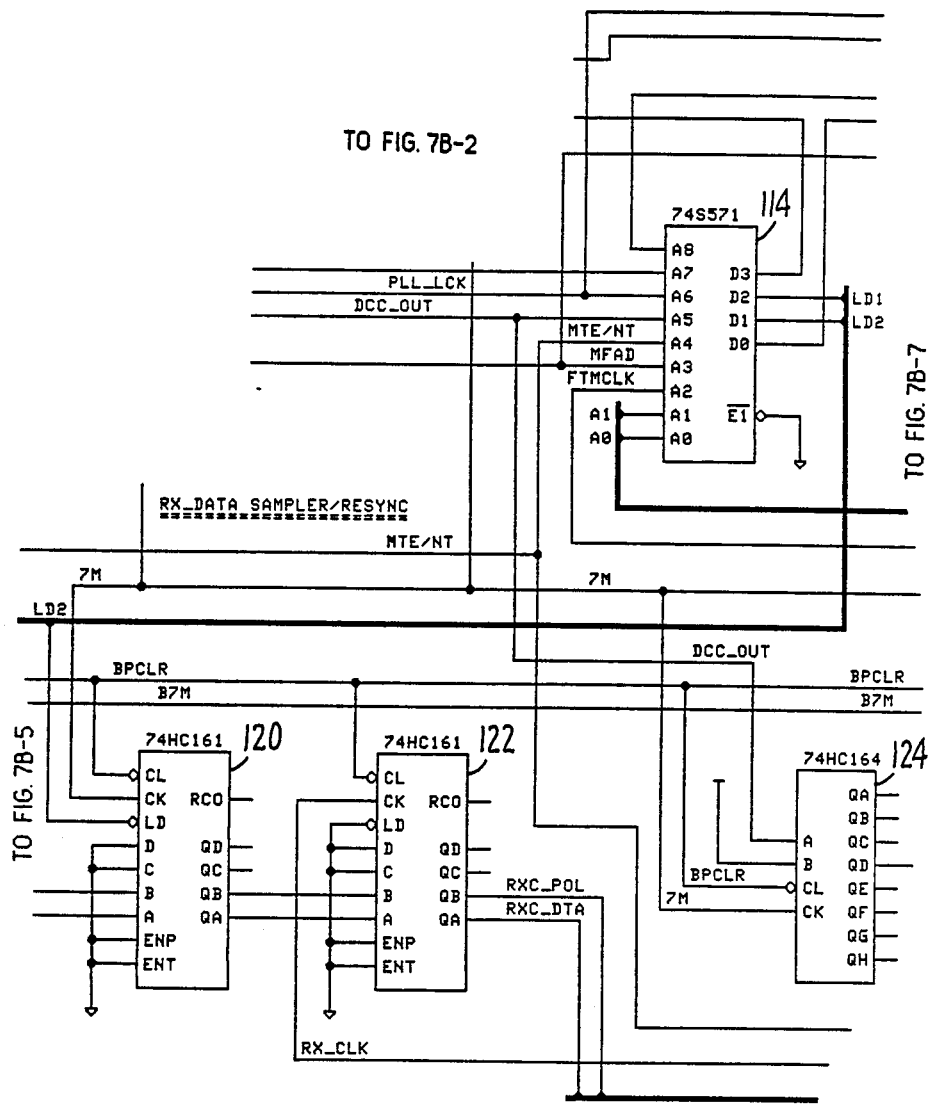
Figures 7, 7B:
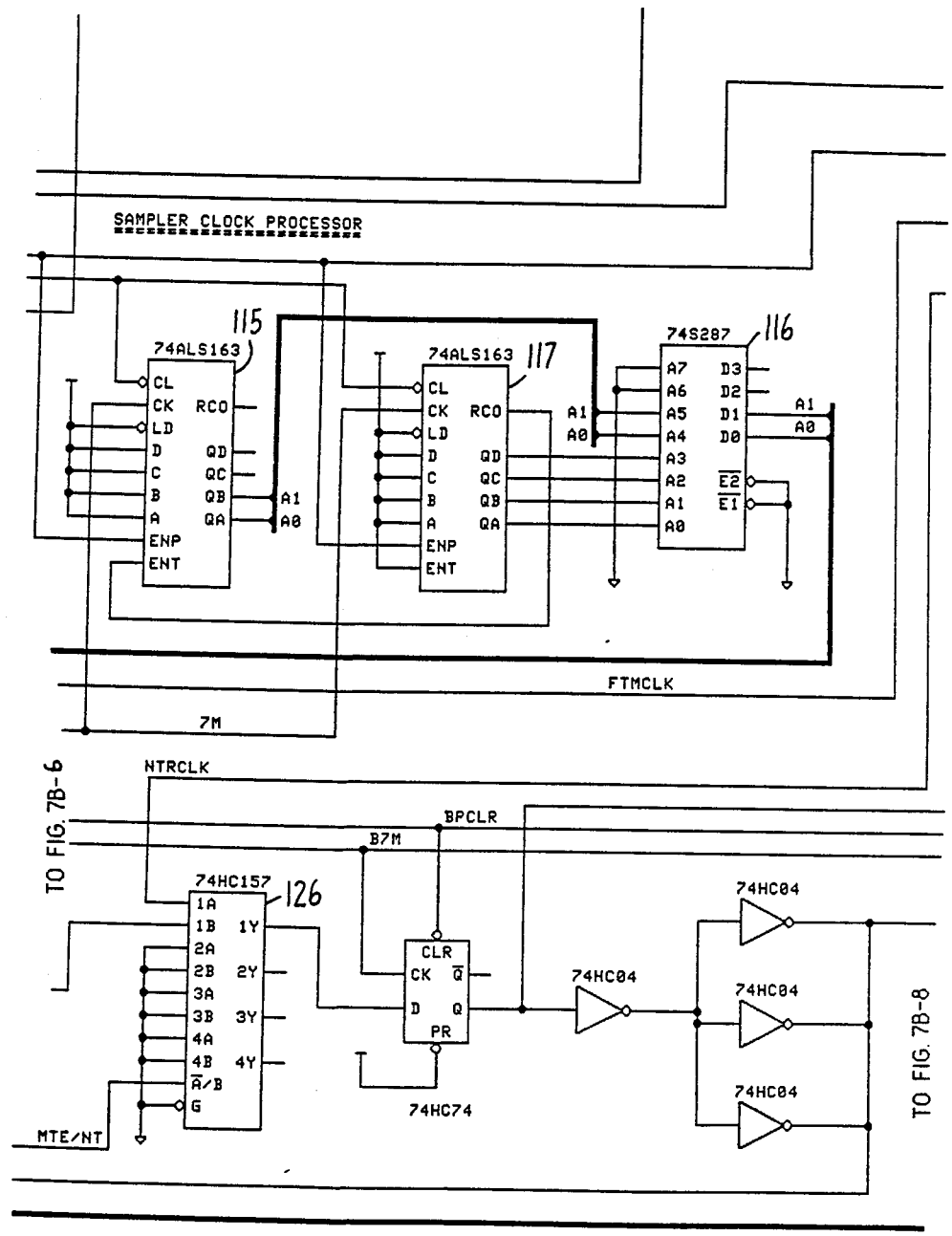
Figures 7, 7B, 8:
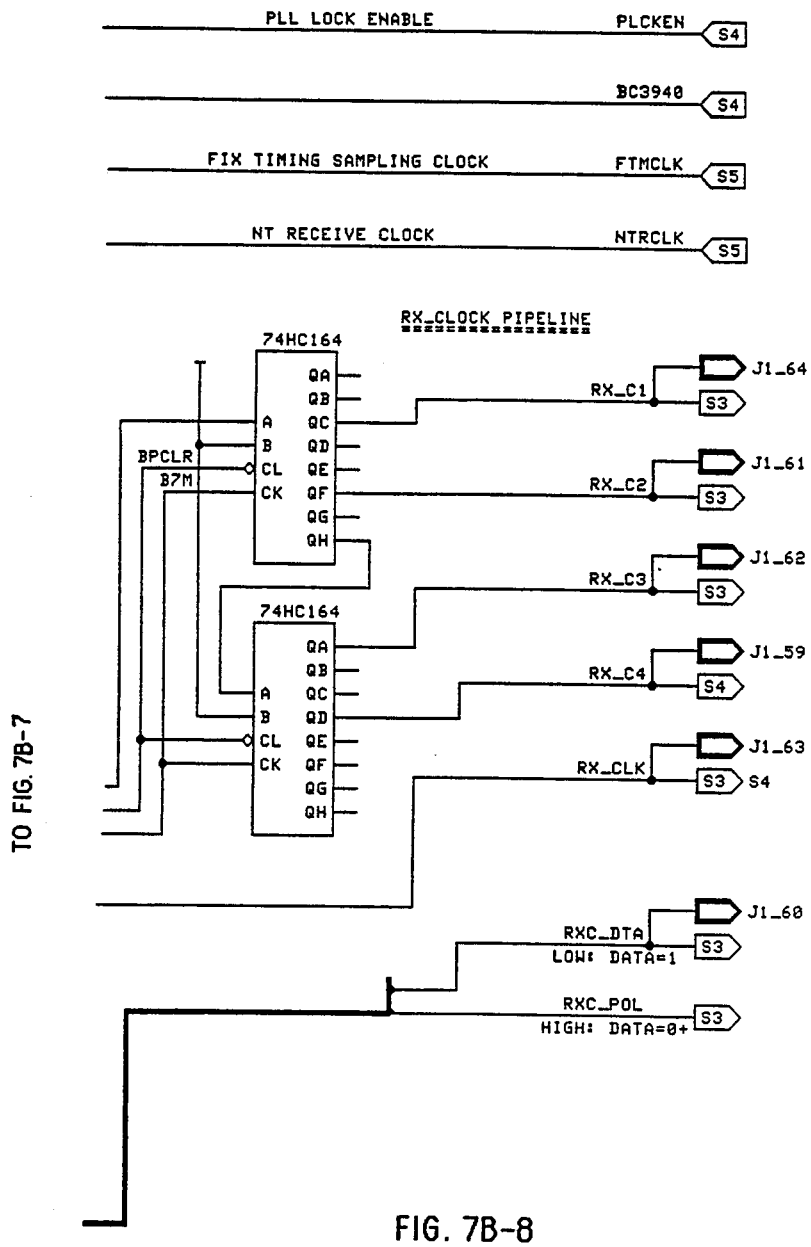

Referring now to FIG. 7B-5, control ROM 86 is in-lock with a PLL timing recovery circuit to be described below. The program coding "AEQCTL.src" for equalizer control ROM 86 is provided in the microfiche appendix. An auto-threshold circuit should be settled-out, e.g., the slicing level of component 34 tracks the peaks of the equalizer output. The "DCC-OUT" signal controls the up/down of the error integrator counters 88, 90 and 92 (see FIG. 7B-1). The DCC-OUT signal, or digital-controlled-clock DCC output, also equals the timing-recovery clock from the PLL or PLL clock available at pin QD of component 85 (see FIG. 7B-2); low to high transitions are normally aligned to the center of the TOPP signal if the input needs no equalization, e.g., short connection between TE and NT.

The counters 88, 90 and 92 are enabled when the "TANDT" signal is high. This signal is available by ANDing the TOPP and TOPPM signals. If the auto-threshold circuit is not settled, the TANDT signal will have either no output or a full output such that there will be no up or down counts passed on to the counters. In the case of no output, the counters are not enabled. In the case of a full output, the up counts will be equal to the down counts since the DCC-OUT signal is centered about the enable window TANDT. In other words, the adaptive equalizer is automatically disabled when the threshold is not settled.

If the RX input is well equalized, the TOPP signal will be centering at the PLL clock rising edges so that up counts equal down counts and no step changes are passed onto component 19 (FIG. 7A-1).

Counters 88, 90 and 92 form a dual speed (8 or 12-bit) error integrator. The integrator has a high tracking-rate when the circuit starts receiving signal after the reset due to the INFO 0 signal, and a low tracking-rate after "frame in-lock" plus 8 good frames. The selection is controlled by the AEQSPD signal derived from the frame synchronizer/lock detector. During the low speed mode, the AEQWDW and BSLOTS signals are enabled. The AEQWDE signal is available at pin A0 of component 86 (see FIG. 7B-5) and is derived from the PLL clock, with a width of window equal to 25% of a bit period, with centering at PLL clock rising-edges. The BSLOTS signal is available at pin A4 of component 86.

If the RX input equals INFO 0, i.e., the BIO signal is low, then the equalizer is reset to flat gain, i.e., no equalization. If in NT fixed timing mode, then the equalizer is disabled, i.e., there is no equalization. Component 94 is a step-update D-latch which is clocked after low-to-high-transitions of the TOPP signal so that distortion at the equalizer output due to injection charge of component 19 during step changes is forced to the center of 0+ bit cells. Otherwise, detection errors are caused.

In accordance with the present invention, and as described above, the quotient algorithm digital-phase-locked-loop portion of the circuit receives the timing signal strobe and the BIO signal as inputs. A binary phase detector with hold-go gating is implemented by using a function of the strobe (F-strobe) to latch a counter that is cycling through a baud. F-strobe is processed by control machine 96 (see FIG. 7B-4) which avoids correction for a no-strobe condition. Components 98 and 100 are no-strobe time-out circuits.

Speed value is calculated on a saturating (bi-directional) speed counter 102 and altered only when triggered by a strobe on a baud period enabled by the BIO signal. Speed is input to ROM 96 to generate the hold-/go signal on a fast or slow basis to feed the digital-controlled-clock DCC. The speed value is fed into the F-strobe monitor which creates a gating signal to the digital-controlled-clock DCC allowing incremental phase to be executed for "x" number of times dependent on the speed.

Figure 2:
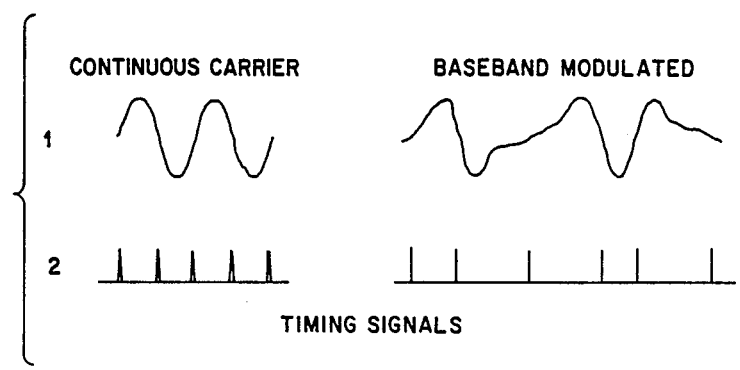
FIG. 2 provides timing diagrams illustrating the continuous carrier and baseband modulated timing signals of the synchronizer shown in FIG. 1.

Referring to FIG. 7B-2, digital-controlled-clock 104 and latch 106 obtain the quotient-digital-controlled-clock and output QI which gates the SCLK signal to result in RCLOCK. The RCLOCK signal is divided by divider 108, 110 (see FIG. 7B-3) to quantify the phase position on a baud interval (baud rate recovered clock) for the binary phase-detector using the most significant bits and the range-phase-detector RPD circuit using a magnitude or-phase-error-comparator. The software generation state for the sequential machines in ROM 96 ("PLLCTL.src"), 112 ("BRPD.src"), ROM 98 ("NOSTB.src") and ROM 104 ("DCC.src") are shown in the microfiche appendix.

The no-strobe decoder 98, 100 used in this portion of the circuit increases the phase-lock-loop gain when seven consecutive missing synchronizing-strobes to the PLL are detected. Otherwise, the PLL would not be able to track an input with excess frequency-offset. The extreme case would be info 3 or 4 without marks at the B, D and SF channels.

A received-data sampler and clocks switching logic utilizes ROMs 114 and 116, the coding algorithms for which "SCLKP.src" and "SCPDEC.src" are provided in the microfiche appendix.

In the TE mode, the first sampler clock, i.e., pins LD and CK of component 118 (see FIG. 7B-5), experience a 0.5 pipeline delay after the PLL clock. Thus, the "Signal Eye" at the filter output is sampled at maximum "eye" opening. The second sampler-clock, i.e., pins LD and CK of component 120 (see FIG. 7B-6), experience 1 pipeline delay after the PLL clock, allowing data to be passed onto the third sampler. The third sampler clock, i.e., pin CK of component 122, experiences a 4.5 pipeline delay after the PLL clock. Since this clock is also used for the TX bit clock, the delay section, i.e., the tap point at component 124, will effect the alignment of the TX zero-crossings to the RX zero crossings. An offset of 3-4%, TX zero-crossings lagging the RX crossings, is recommended.

In the NT adaptive timing mode, the first sampler clock, i.e., pins LD and CK of component 118, experience a 0.5 pipeline delay after the PLL clock. Thus, the "Signal Eye" at the filter output is sampled at maximum opening. The second sampler clock, i.e., pins LD and CK of component 120, as derived from a free-running counter with frequency synchronized to the TX bit clock. If the PLL is out-of-lock, the counter is phase synchronized to the PLL clock with rising edges equal 20 pipeline delay (half of a bit period) after rising edges of the PLL clock. If the PLL is in-lock, the synchronizing link to the PLL is defeated and the counter left free-running and the frequency is synchronized to TX bit clock. Thus, it samples at maximum opening of the Signal Eye for the first sampler 118. The third sampler is clock 122. Therefore, the received data output has the same timing as the transmitter.

In the NT fixed timing mode, the first sampler clock 118 has a 0.5 pipeline delay after the fixed timing clock, i.e., pin A2 of component 114, i.e., a fixed relationship to the TX bit clock. The second sampler clock 120 experiences a 1 pipeline delay after the fixed timing clock to allow data to pass onto the third sampler. The third sampler clock 122 is connected to the TX bit clock so that the receive data output has the same timing as the transmitter.

Figures 1, 7C:
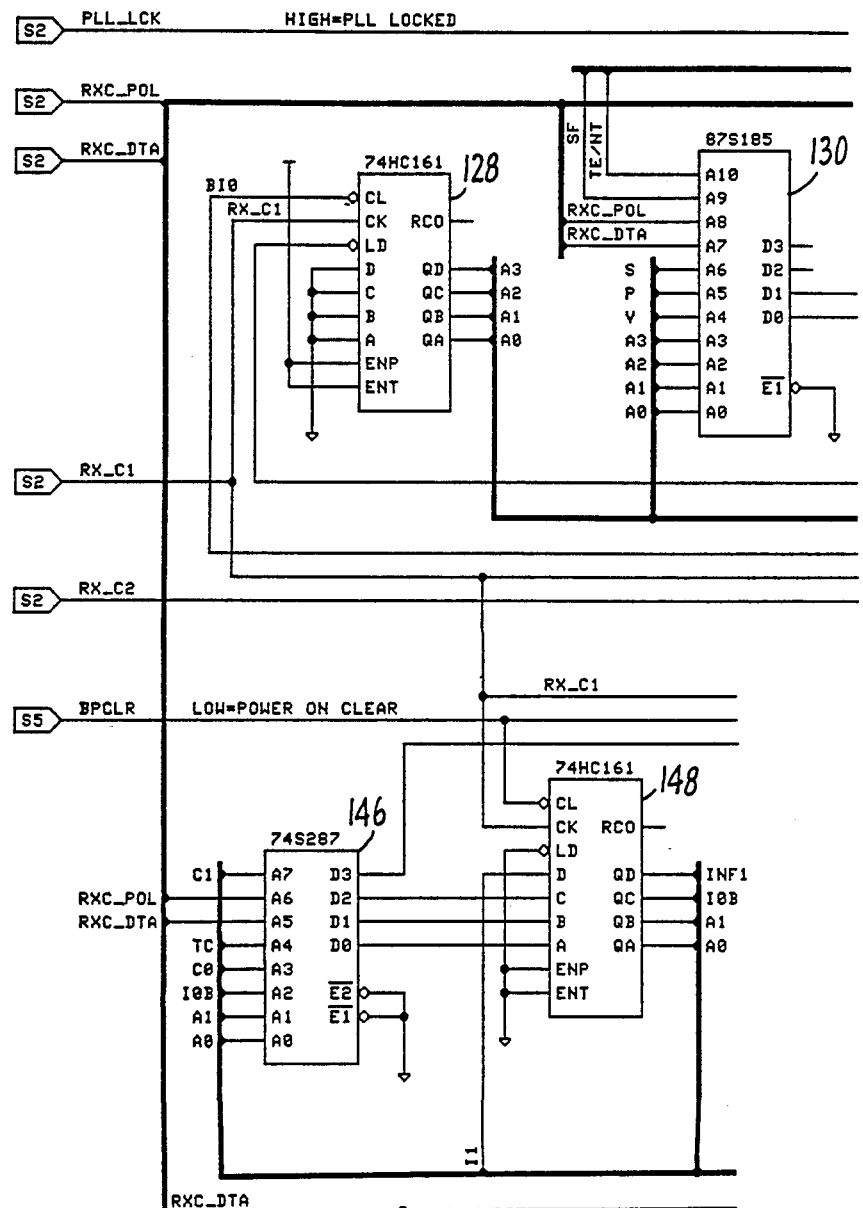
Figures 2, 7C:
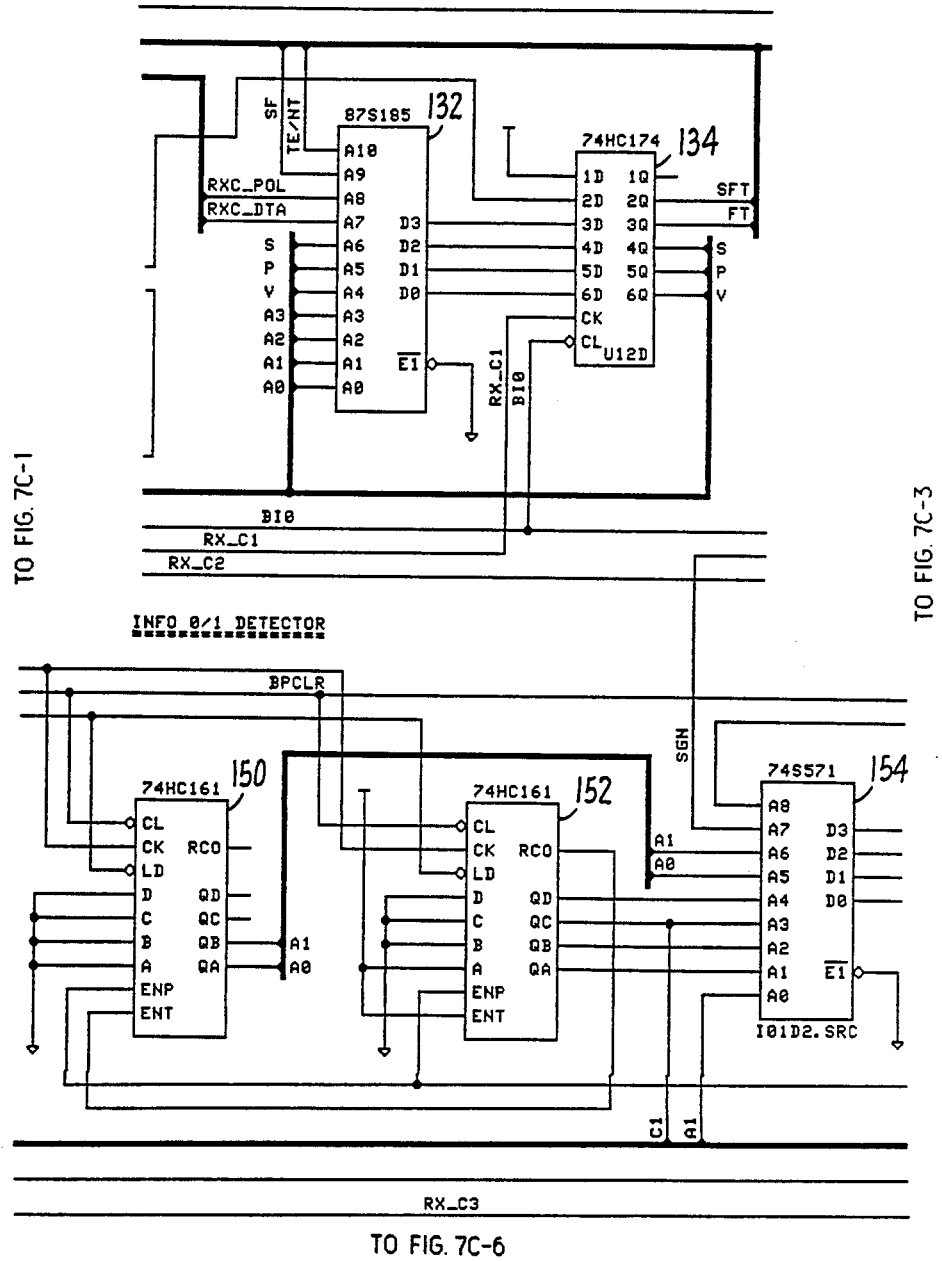
Figures 3, 7C:
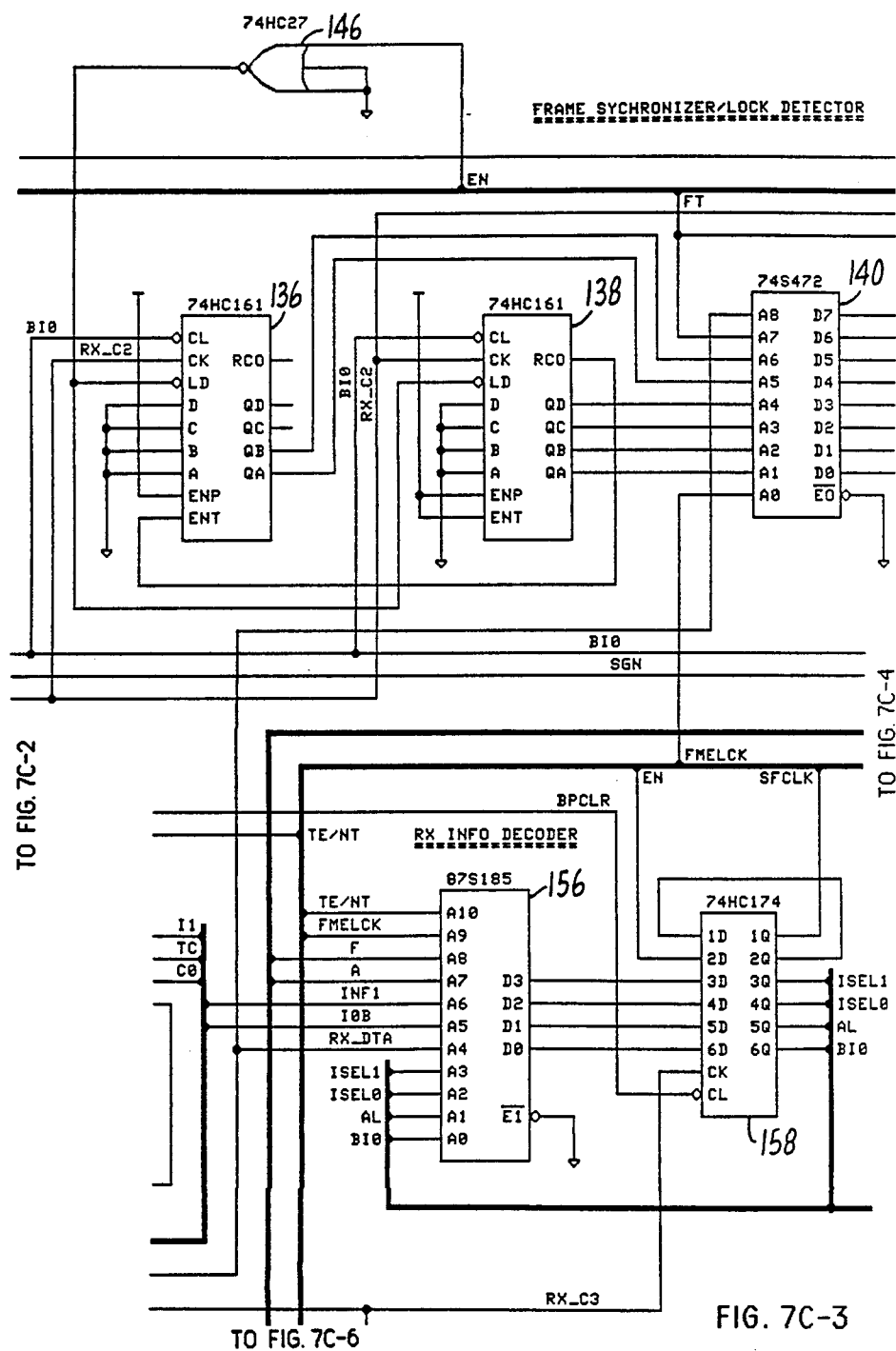
Figures 4, 7C:
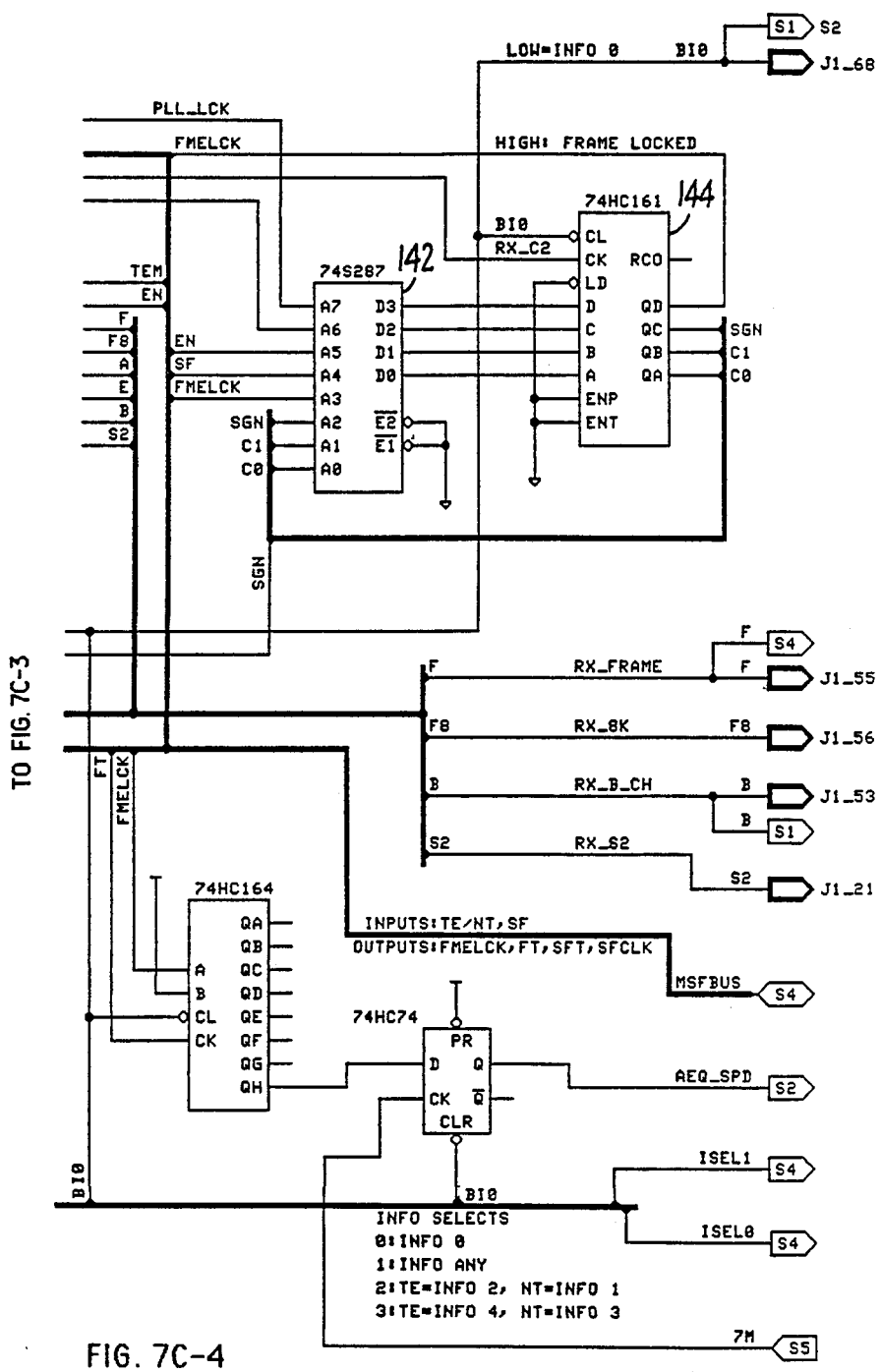
Figures 5, 7C:
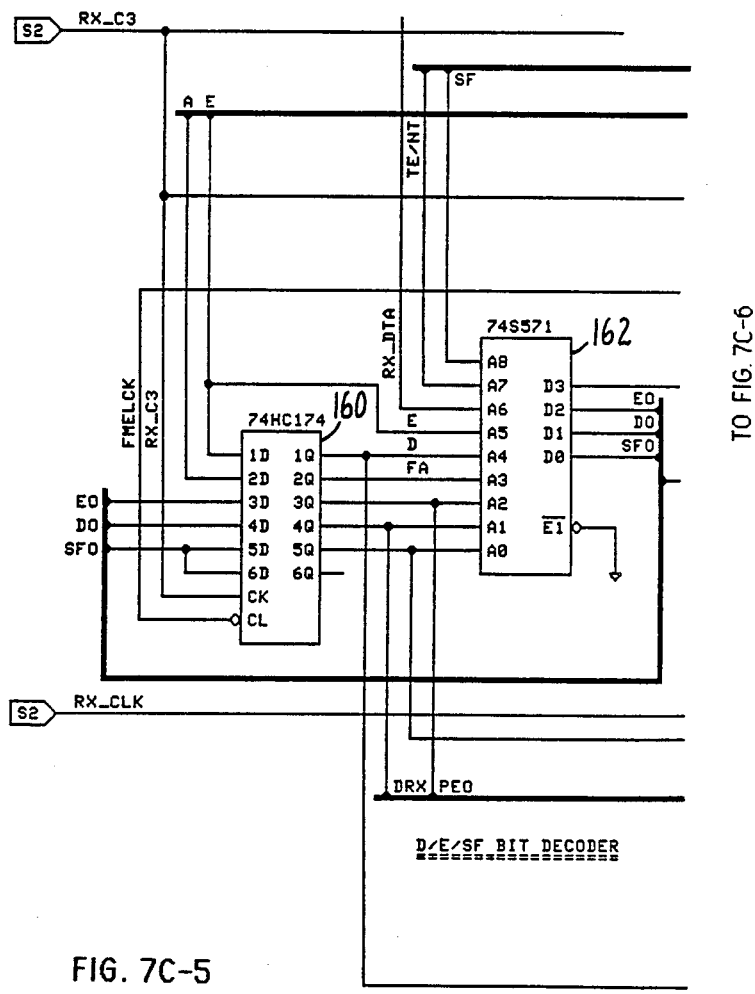
Figures 6, 7C:
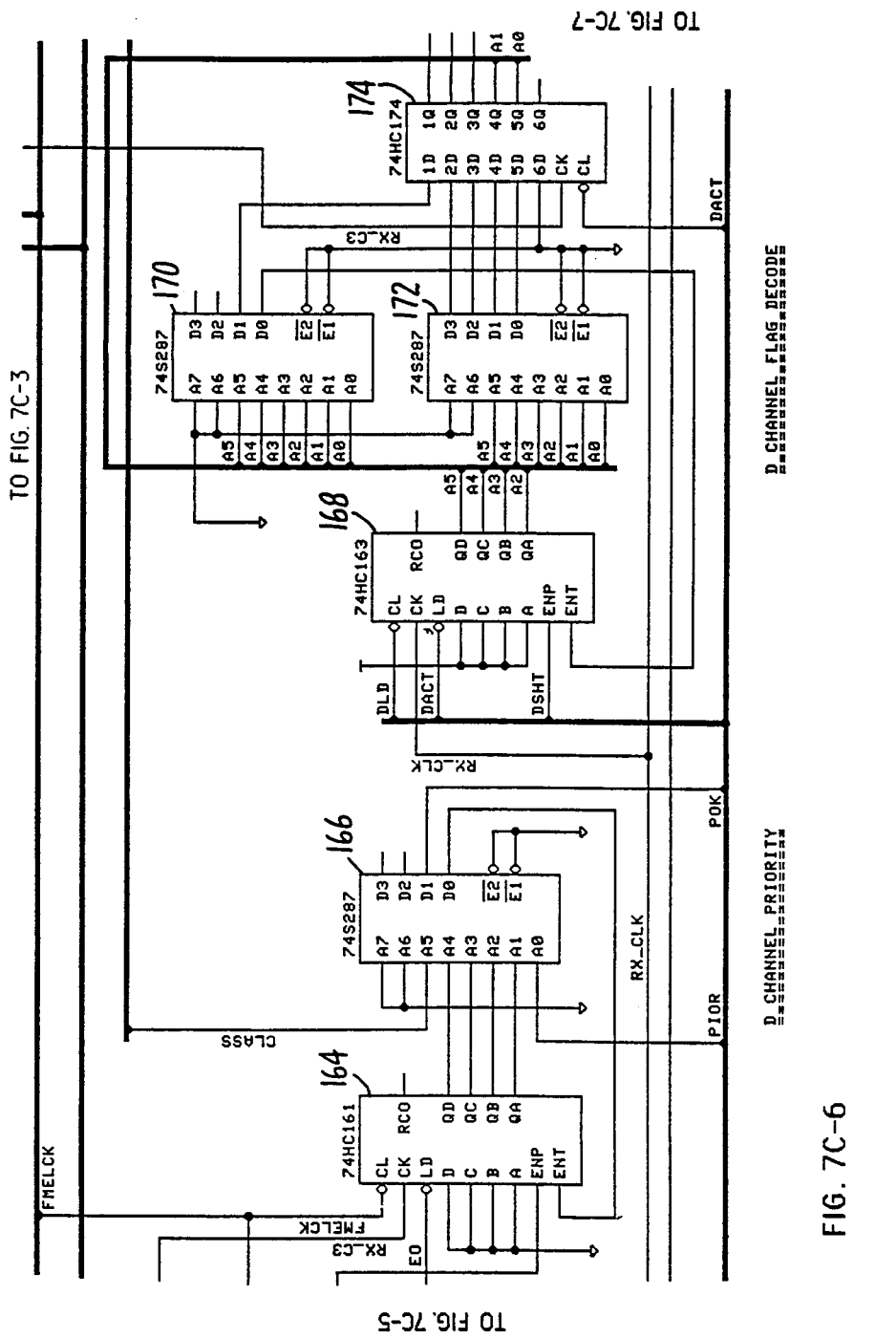

Referring to FIGS. 7C-1 and 7C-2, components 128, 130, 132 and 134 form a frame trigger pulse decoder.

As shown in FIGS. 7C-3 and 7C-4, components 136, 138, 140, 142, 144 and 146 form a frame synchronizer/lock detector. Three consecutive good frames plus the PLL in-lock equals a frame-in-lock. Three consecutive BAD frames equal a frame-out-of-lock. If the input equals INFO 0 (BIO=low, then the frame is out-of-lock). The $R_x$ bit id outputs are as follows:

B1 channel: B (pin D1 of component 140)=high F8 (pin D4 of component 140)=high
B2 channel: B (pin D1 of component 140)=high F8 (pin D4 of component 140)=low
S2 channel: S2 (pin D0 of component 140)=high
D channel: Decoded as described below
SF channel: Decoded as described below
Note: F8 also provides half-frame timing PROM 140 (see FIG. 7C-3) also decodes the polarity of the M bits (super frame) for generating the M-clock in the TE mode.

Referring to FIGS. 7C-1, 7C-2 and 7C-3, components 146, 148, 150, 152, 154, 156 and 158 combine to form info decoders. The info recognition criteria are as follows:

INFO 0: If no 0+ or 0− pulses for 64 data bits, BIO (bar info 0) goes low at frame boundaries.
INFO 1: NT mode, 8 consecutive "0011xxxx" frame received, "x" denotes either 0 or 1, the two consecutive 0s must be opposite in polarity and consistent through the 8 frames.
INFO ANY: Circuit detects Info Any after receiving two opposite "0" pulses ("0+, 0−" or "0−, 0+"). If other info types can be unambiguously recognized the detector will flag the actual info types instead. Normally, Info Any indicates the receiving of I2, I3 or I4 when the framing circuit is not in-lock, i.e., loss of framing or before locking.
INFO 3: NT mode, frame in-lock
INFO 2: TE mode, frame in-lock, "A" bit=binary 0 (0+ or 0−)
INFO 4: TE mode, frame in-clock, "A" bit=binary 1

A D-channel access/E-channel logic circuit is formed by components 160, 162, 164, 166, 168, 170, 172, 174, 176 and 178 (see FIGS. 7C-5, 7C-6 and 7C-7). Components 160 and 162 are a D/E/SF transmit-data decoder. Pins D3 and D2 of component 162 provide the E-bit outputs which control "C" counter 164. Pin 3Q of component 160 is a pipelined E-bit output which drives component 176 for transmission E-bit data input to the transmitter in the NT mode. Pin 5Q of component 160 is the super-frame transmit-data output for NT mode only. In the TE mode, this pin decodes the inverted $F_A/N$ bits from the NT output to qualify the generation of the M-clock. Components 164 and 166 form a "C" counter, with pin D1 of component 166 high if the D-channel is available, i.e., "C" count is ≧ the current priority level. Both the class and the priority signals are inputs to this counter. The circuit is disabled if the frame is out-of-lock. Components 168, 170, 172 and 174 combine to form a D-channel flag-decoder. The "LSTD" signal or last-transmitted D-bit from the local transmitter, on pin 1Q of component 174 feeds component 176 for error flag generation. If this flag is found true, the D-channel access is terminated immediately, i.e., the DACT signal on pin A1 of component 176 goes low. The transmitter sends binary 1s in the D-channel afterward regardless of the state of the transmitter data input. There are no more DSHT (D-channel data shift-/enable) pulses to the outside world for requesting data. Priority remains the original value, i.e., high priority.

The HDLC Closing flag CFLG at pin 2Q of component 174 goes high after the transmission of "01111110 D . . . D 01111110" in the D-channel, where "D . . . D"=any data pattern except HDLC flags. If a continuous seven 1's pattern is embedded in the "D . . . D" sequence, then the flag "01111110" after the seven 1's pattern is considered to be the opening flag again. Without the seven 1's pattern, this sequence would be the closing flag. The next "01111110", i.e. third flag starting from the beginning of the transmitted message, becomes the actual closing flag. It should be noted that the "0" between two flags can be shared by the two flags: i.e. "0111111101111110" contains an opening flag and a closing flag. After the closing flag, the D-channel is considered to be deactivated. The circuit functions the same way as the deactivation caused by the D<>E error flag except that the priority is set to low priority.

The "C8" signal at pin 3Q of component 174 goes high if D-channel transmitted data was eight consecutive 1's. After this flag, the D-channel access is deactivated. This is similar to the closing flag case except there are no priority changes.

The D-channel request input "DREG" at pin A8 of component 176, connected to an external microcontroller, goes high if TE wants to access the D-channel. If pin A5 of component 176 is high, i.e. the D-channel is available, and DREQ is high, then DACT is high showing that the D-channel is activated. If any of the error flags (E<>D, CFLG, C8) are detected, then DACT goes low showing that the D-channel is deactivated. Priority output at pin 5Q of component 178 is high (low priority) if deactivation is due to CFLG. If frame is out-of-lock during activation, then the D-channel access is terminated immediately the same way as caused by other flags. The implementation is achieved by resetting the D-channel circuit, including the C counter, to its power-up state. In other words, D-channel access is only possible when the frame synchronizer is in-lock.

Figures 1, 7D:
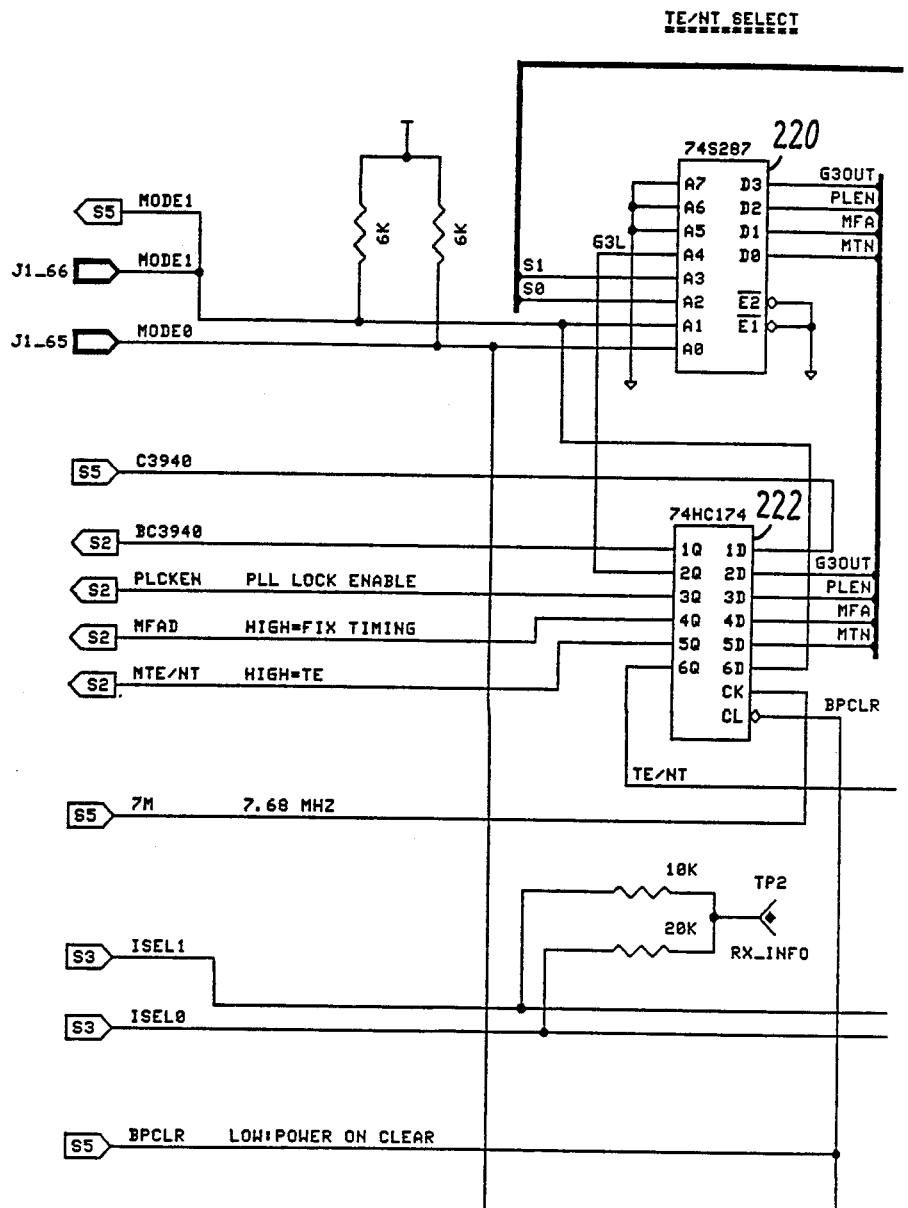
Figures 2, 7D:
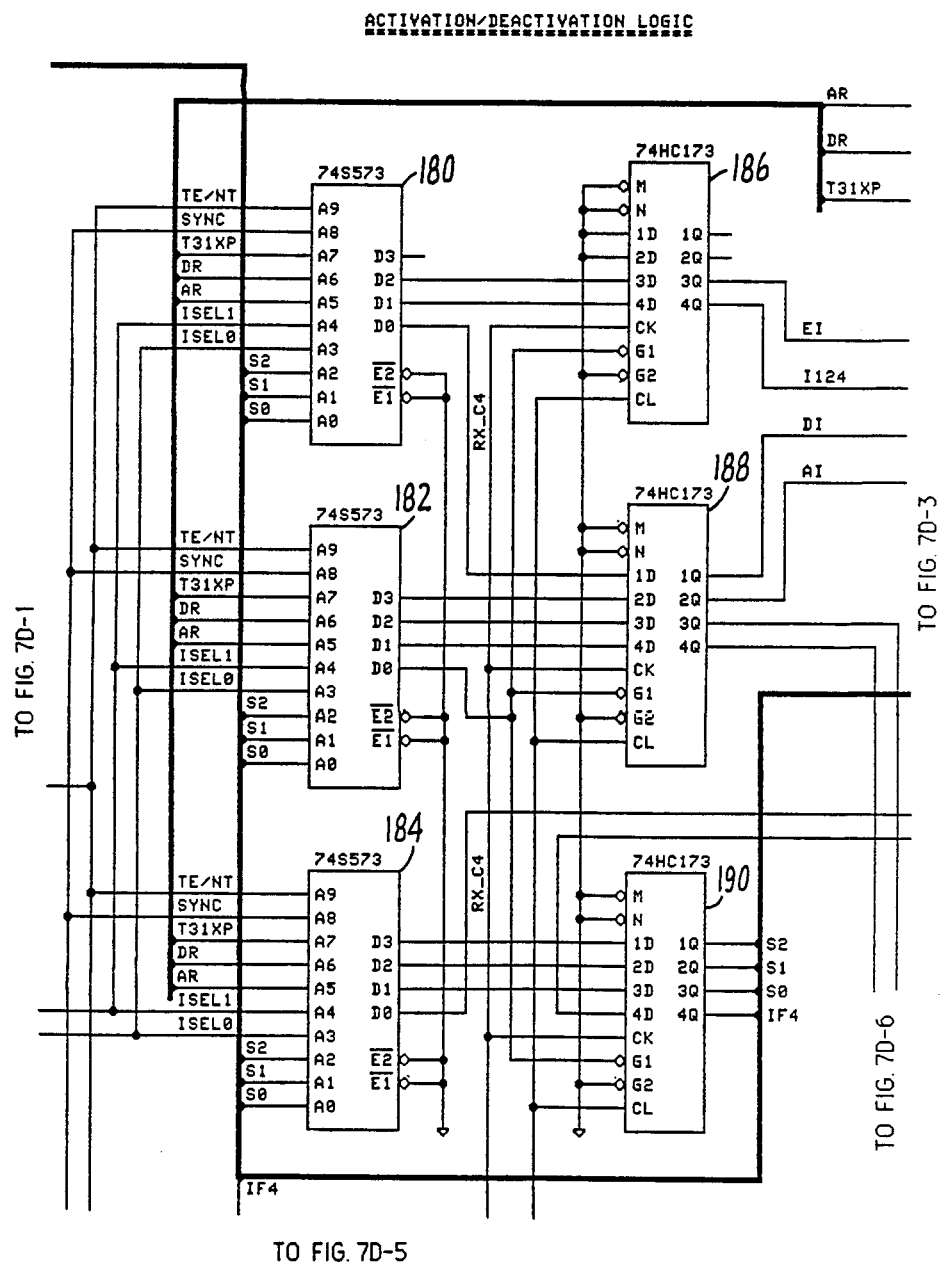
Figures 3, 7D:
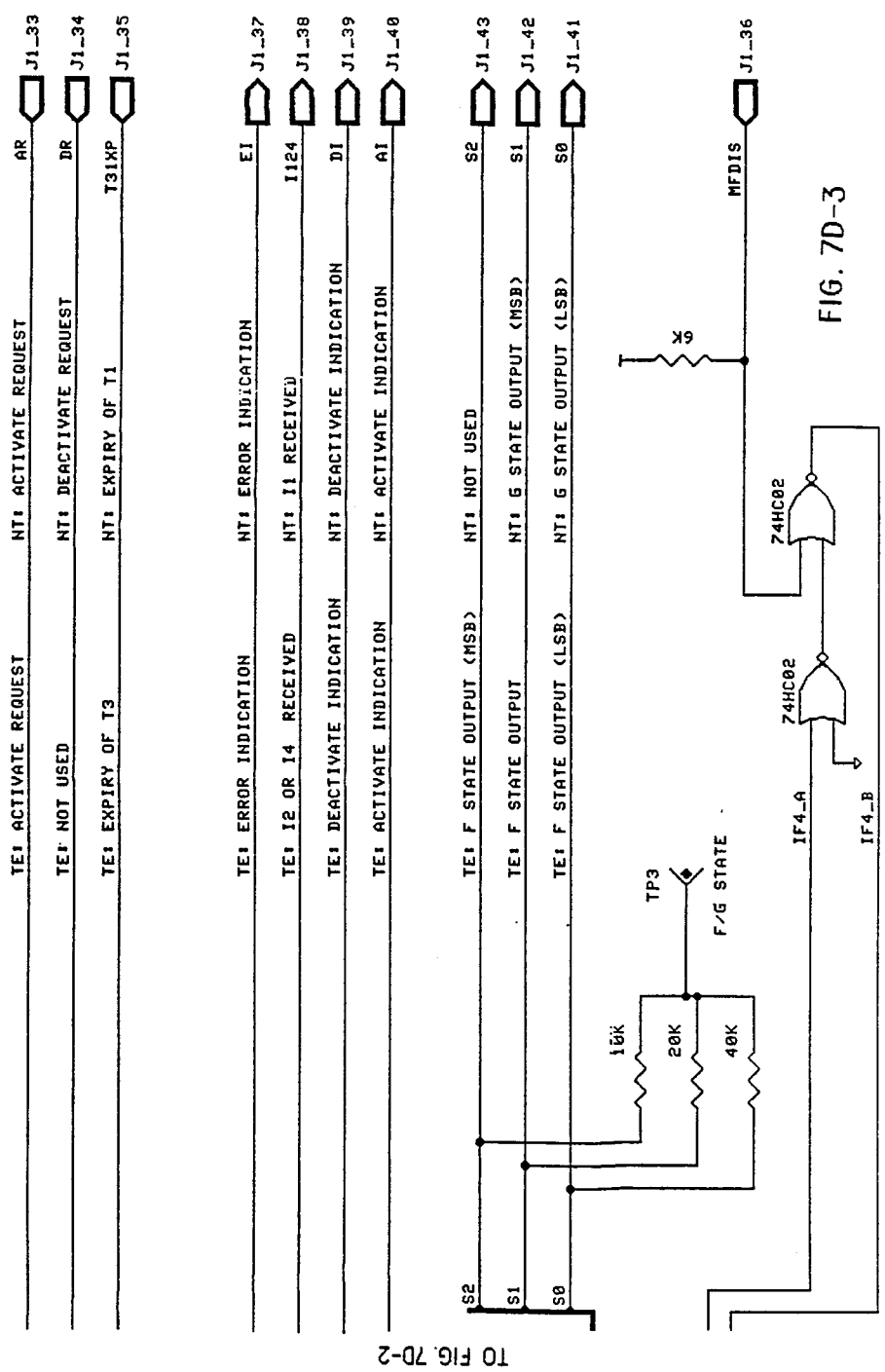
Figures 4, 7D:
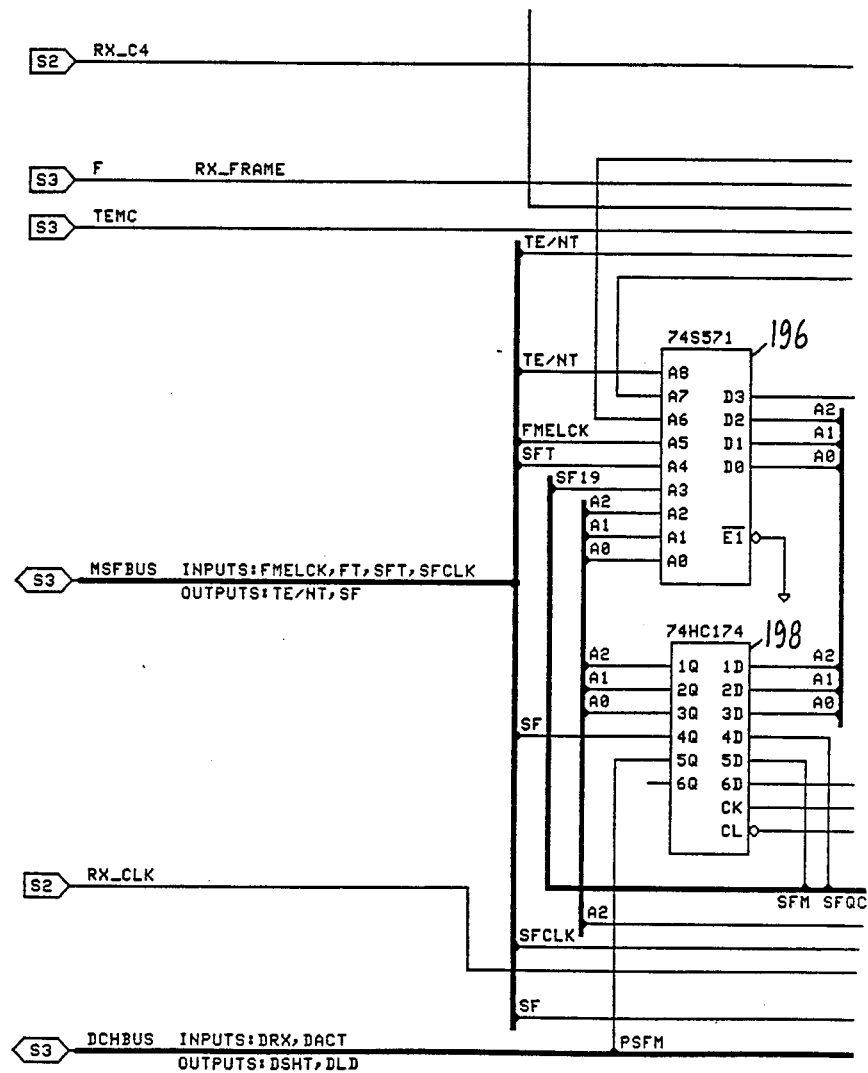
Figures 5, 7D:
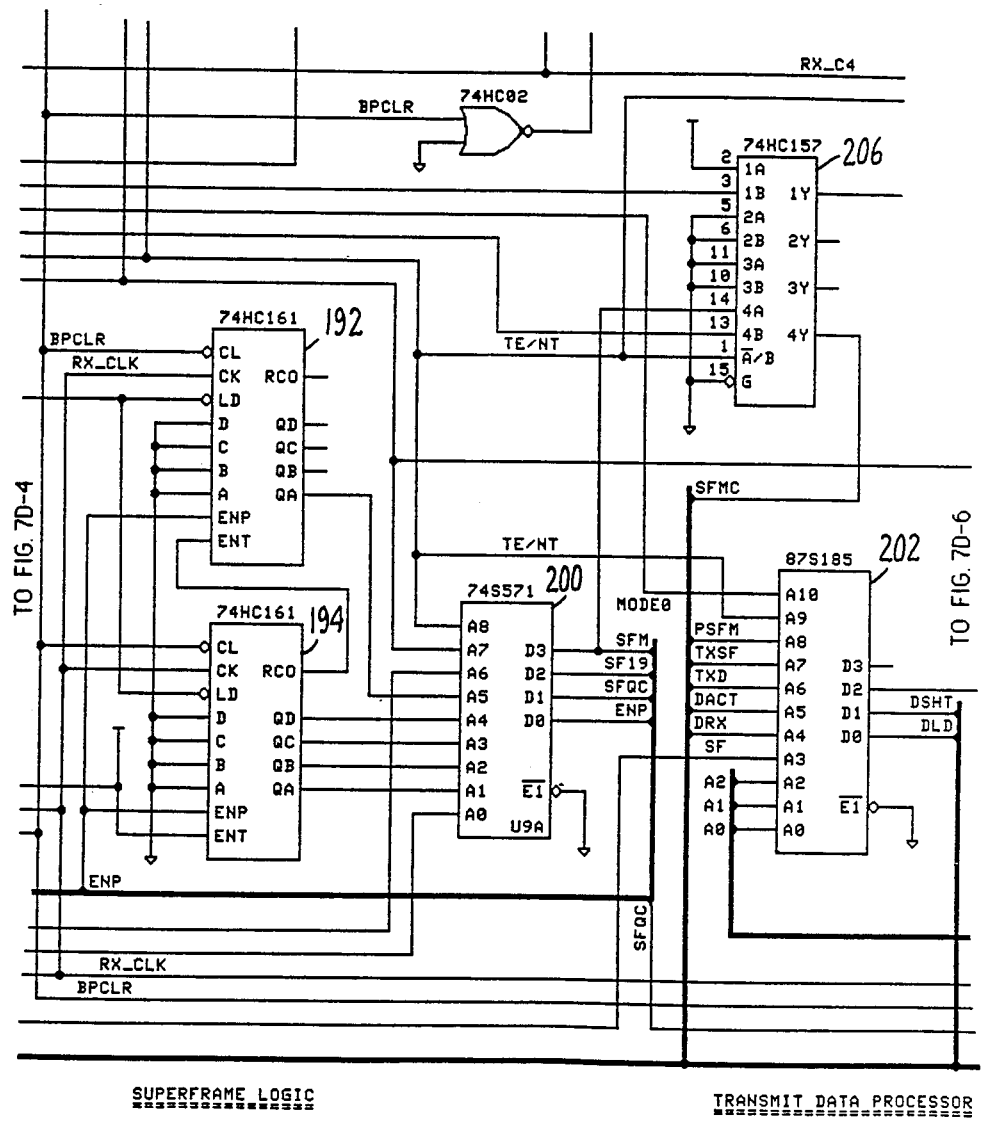
Figures 6, 7D:
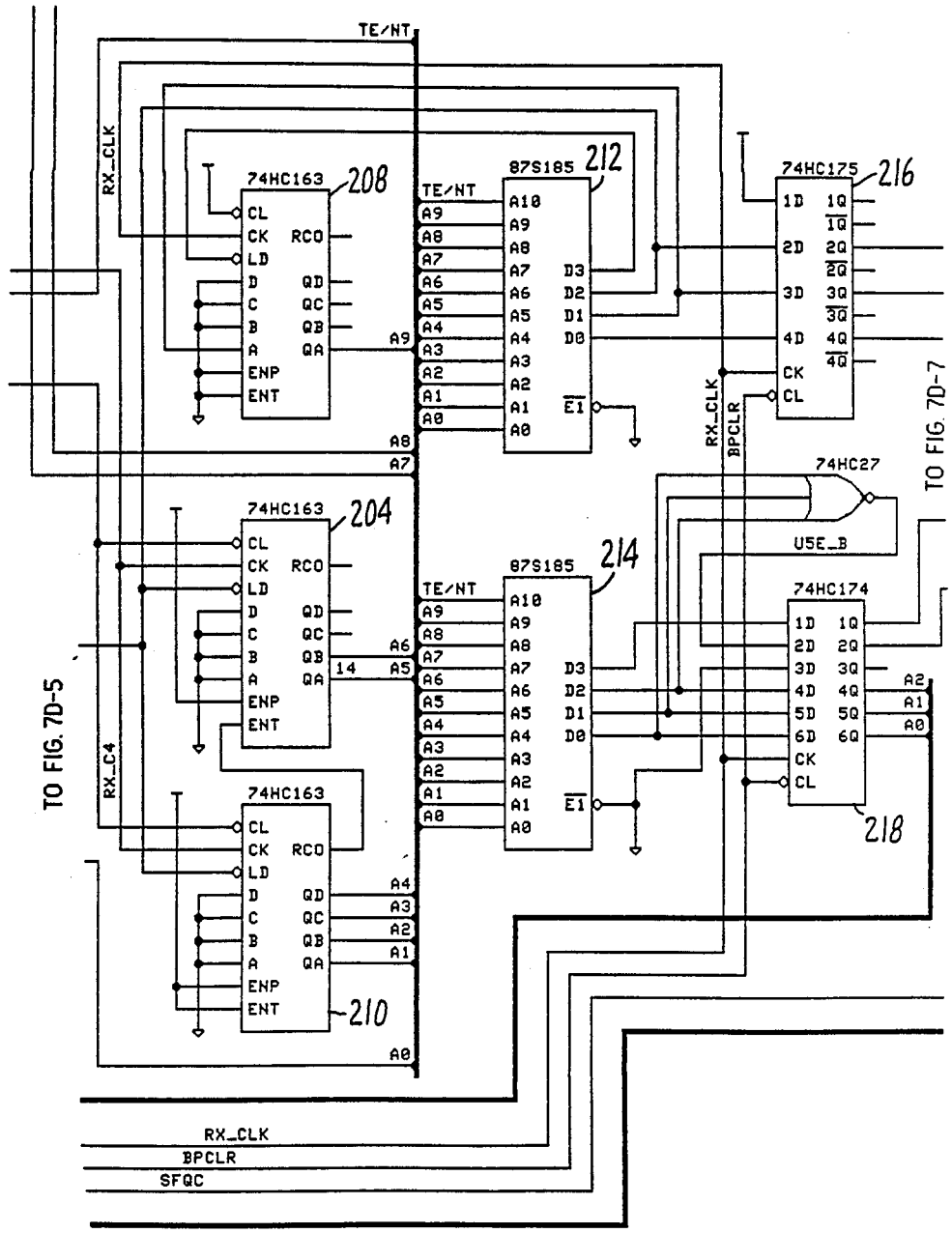
Figures 7, 7D:
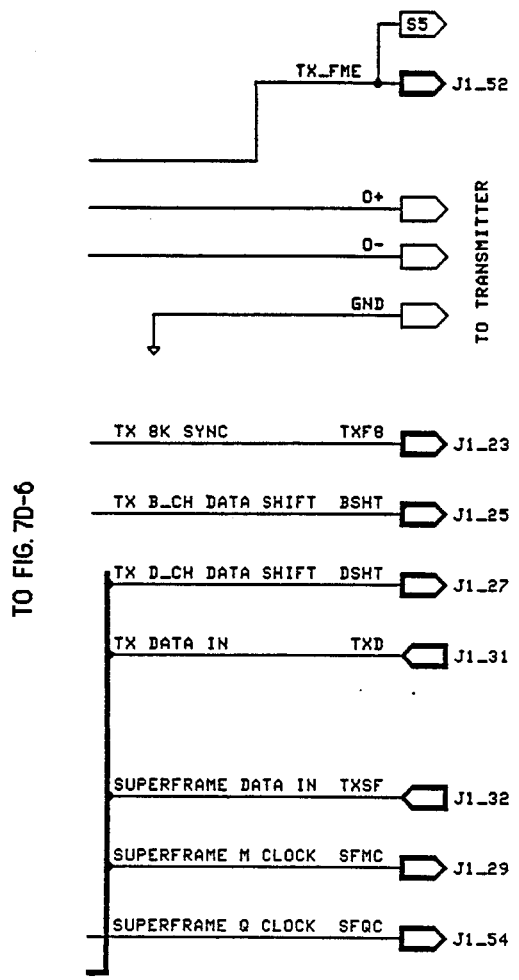

Referring to FIG. 7D-2, activate/deactivate logic is provided by components 180, 182, 184, 186, 188 and 190. The Coding algorithm "ADLGC.src" for ROMs 180, 182 and 184 is provided in Appendix K at the end of this specification. Appendix L provides the recommended subroutines for external up and input latch circuit for AR (Activation Request), DR (Deactivation Request) and T31XP (Timer 3/1 expiry). Note that I124 indicates the receiving of INFO1(NT) or INFO2/4(TE). This signal is sent to the external microprocessor through the wire for activation acknowledgment.

Components 192 and 194 (see FIG. 7D-5) form a frame counter for deriving superframe sequence, i.e. modulo=20 in NT mode, 5 in TE mode. Components 196 and 198 (see FIG. 7D-4) form a superframe counter controller. In the TE mode, counter 192, 194 is synchronized to the SFT (superFrame trigger) signal from the frame-trigger decoder described above. If >=3 consecutive SFT's, then the circuit assumes in lock, i.e. TE superframe TX channel is enabled. If three consecutive SFT pulses are found missing or INFO0 is detected or the Frame synchronizer is out-of-lock, then the circuit assumes out-of-lock, i.e. TE superframe TX channel is disabled. In the NT mode, counter 192, 194 is synchronized to transmitter. If TX equals INFO4, then the superframe sequences are transmitted.

Component 200 (see FIG. 7D-5) provides superframe enable/disable and clock switching functions. Pin D3 of component 200 derives a "1 out of 20" frame sequence from the outputs of counter 192, 194 for generating the M clock SFMC in the NT mode if TX=INFO4. The SFMC signal is switched to receive it's input from the frame synchronizer in the TE mode (i.e., pin D3 of component 200 is not active). In the NT mode, the M clock provides timing information to the transmit data processor 202 for encoding the M(S1) bit.

Pin D1 of component 200 derives a "1 out of 5" frame sequence from the outputs of counter 192, 194 for generating the Q clock SFQC. In the NT mode, the Q clock is enabled if TX=INFO4. In the TE mode, the Q clock is enabled when Superframe timing is in-lock. This clock feeds two elements: transmit data-processor 202 and frame synchronizer/lock detector 204 (see FIG. 7D-6). The first connection provides timing information to the transmitter for encoding the Fa/N (INFO4) or Fa/L (INFO3) bits. The second connection forbids the frame locking circuit 204 from responding to missing frame trigger pulses during superframes.

The S2 signal is the data output in the TE mode and can be decoded from RXC-DTA with RX-S2. The signal is also the S2 data-input to the NT transmitter.

Referring to FIGS. 7D-5 and 7D-6, a transmit data processor/encoder is formed by components 206, 202, 208, 204, 210, 212, 214, 216 and 218. The signal TXD at pin A6 of component 202 is the TX B/D channel data input, 1=0+ or 0−. The B-channel data path is enabled by signals BSHT and TXF8 at pins 2Q and 1Q, respectively, of component 218: channel B1 is selected when TXF8 is high and BSHT is high; channel B2 is selected when TXF82 is low and BSHT is high. The TXF8 signal also provides half-frame timing.

In the TE mode, the D-channel data path is enabled by DSHT at pin D1 of component 202. If the D-channel is not activated (DACT=low), then DSHT pulses are not outputed and transmit data is automatically set to binary 1. In the NT mode, the DRX signal at pin A4 of component 202 and the E-bit TX data input is connected to the D-channel RX output and multiplexed by component 202 into the TX data path. Pin A7 of component 202 provides the superframe data input (TE mode only).

In the NT mode, the transmitter is frame synchronized to an external source (U-Interface) by either shortening (39 counts) or widening (41 counts) the last L bit period. In the TE mode, the transmitter is frame synchronized to the RX-frame with a 2-bit offset.

As shown in FIG. 7D-1, components 220 and 222 provide TE/NT select. In NT modes, the receiver is configured as adaptive timing mode (similar to receiver in TE mode) for receiving asynchronous Info1 signal. After INFO1 is recognized, the receiver is switched back to normal mode. In the NT adaptive timing mode, if NT changes from the G3 state to the G2 state, due to loss of framing or upon receiving INFO0, pin 3Q of component 222 will issue a low-going pulse for resetting the PLL locking circuitry, thus causing phase re-estimation of the second sampling clock.

Referring now to FIGS. 7E-1, 7E-2 and 7E-3, an NT frame synchronizer is formed by components 222, 224, 226, 228, 232, 234 and 236. The NT receiving clock NTRCLK, pin QC of component 224, is at 192 KHz and is generated by dividing 7.68 MHz with a modulo of 40 in components 232 and 234. For each bit period, there are forty 7.68 MHz clocks. The NT frame sync input signal NTFSYN at pin B of components 224 is provided for an external 8 KHz sync signal to synchronize the framing of the transmitter. If there is no signal at this input, the transmitter frame clock provided at pin A9 of component 236 is free running at the sub-multiple (/40, 40 clocks per bit; and then /48, bits per frame) of the crystal frequency (7.68 MHz). If an external sync-signal is applied to this input, then the counters 232, 234 will either add or subtract a count during the last bit of each frame until the frame-timing is frequency locked to the positive edges of the external input. The coding algorithm component 236 does not allow consecutive opposite changes (e.g., 39 in one frame and 41 in the next frame): the counters have to step through the normal state (/40) before the next opposite change. The counters 115, 117 (FIG. 7B) used in the sampler-clock processor are also frequency-locked to the external sync signal in NT adaptive timing mode. This is accomplished by the signal BC3940 connecting between pin D2 of component 236 and pin ENP of component 117.

Figure 7E:
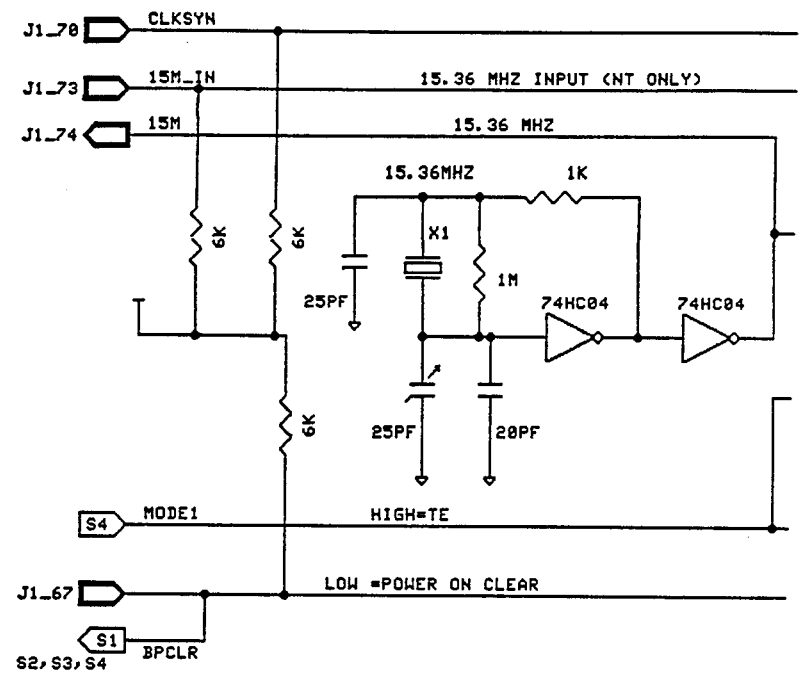
Figure 1:
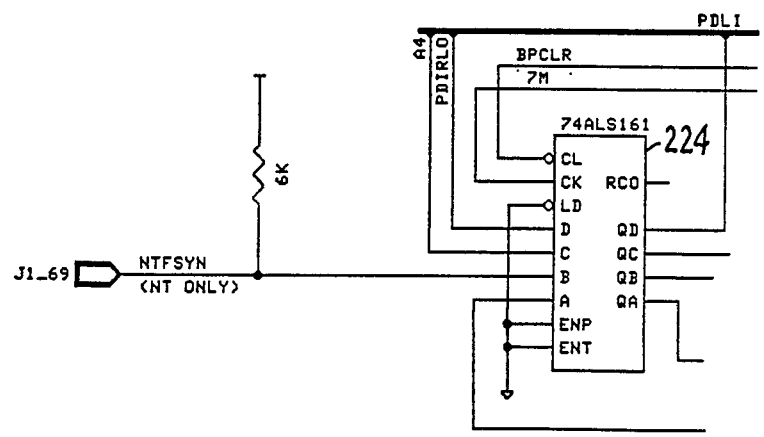
Figures 2, 7E:
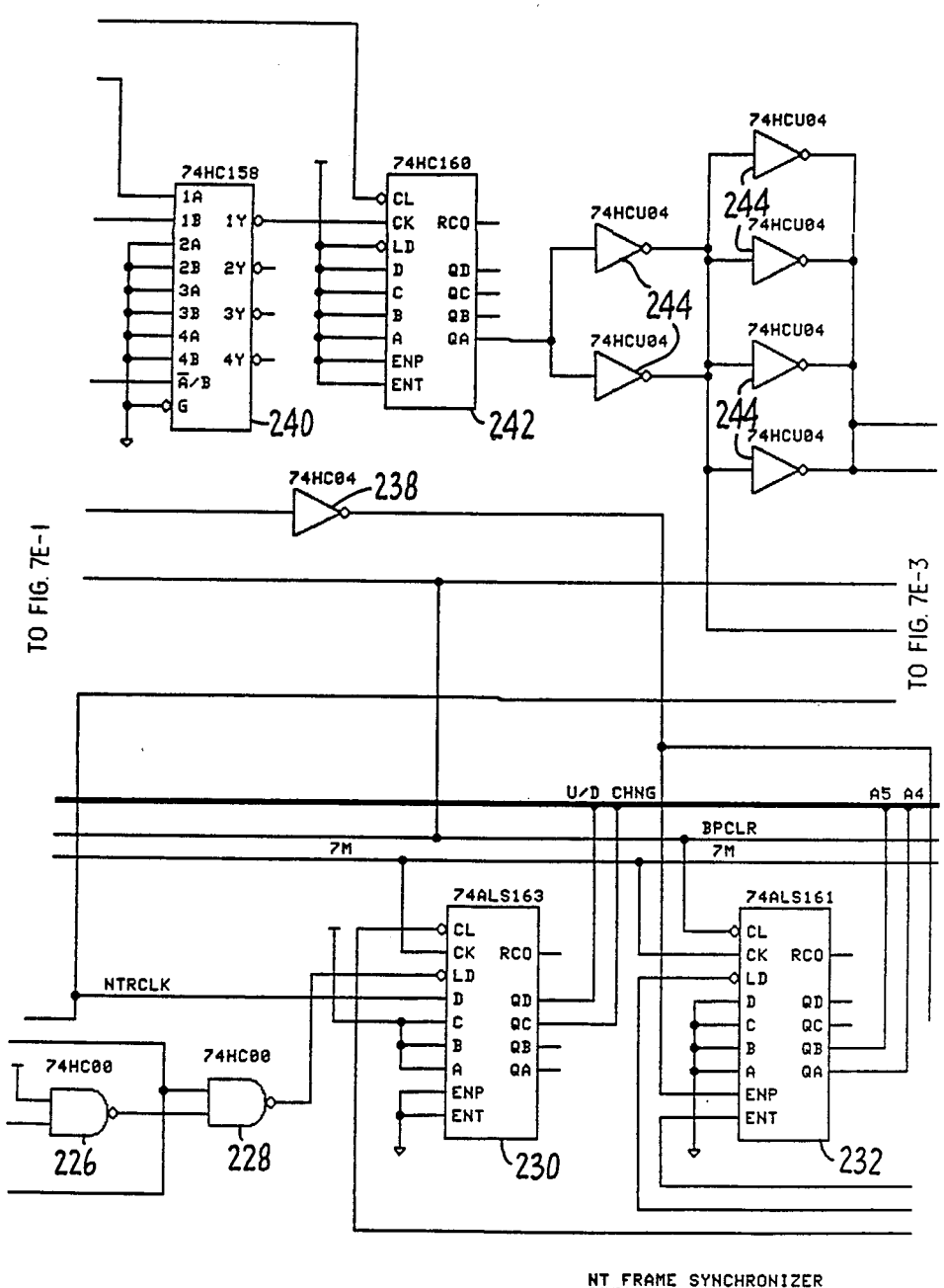
Figures 3, 7E:
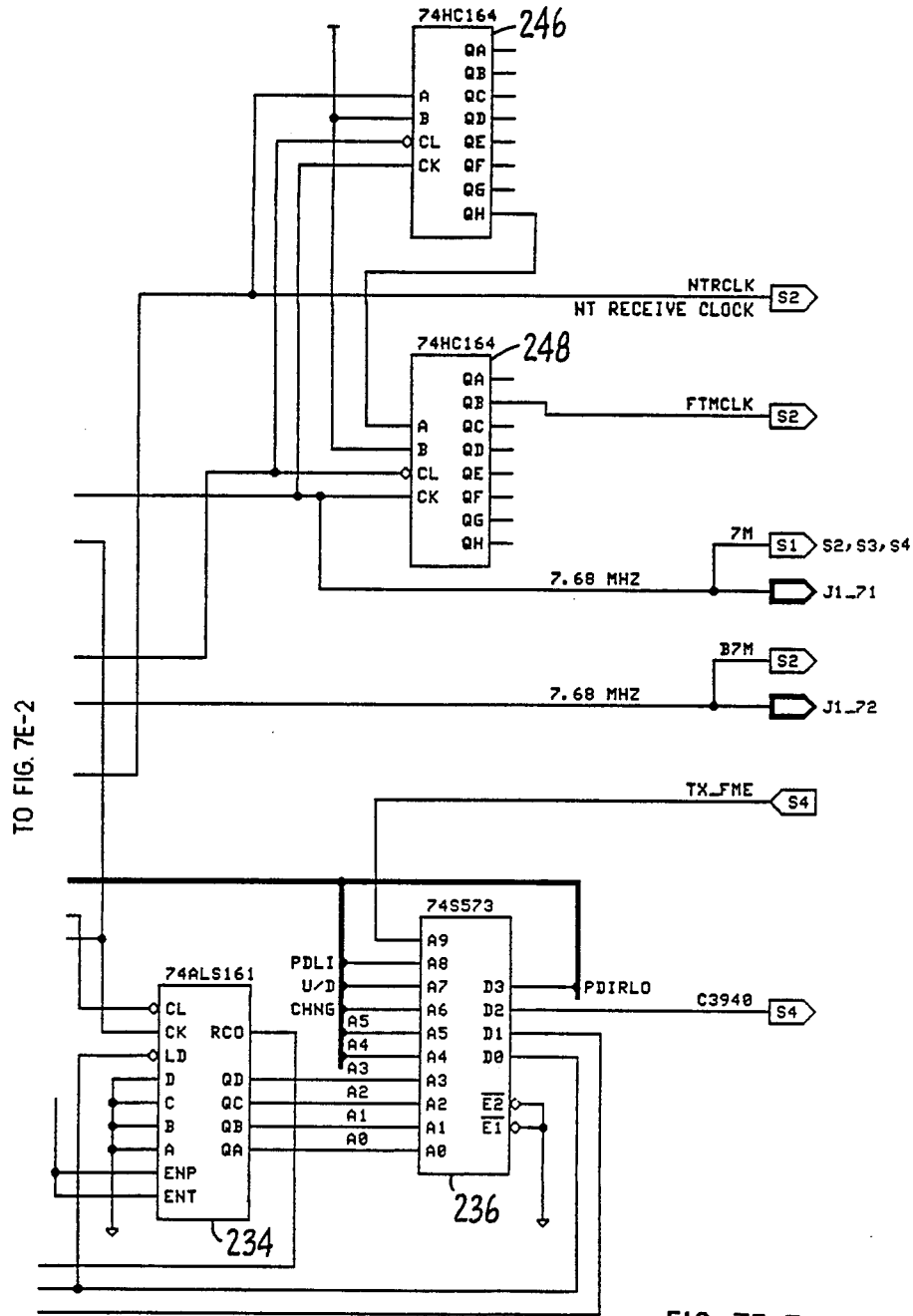

As shown in FIGS. 7E-2 and 7E-3, a system clock-generator is formed by components 238, 240, 242, 244, 246 and 248. The clock input is 15.36 MHz crystal in the TE mode and 15.36 MHz external input in the NT mode from the U-Interface. The fixed timing sampling clock signal FTMCLK at pin QB of component 248 can be moved to other taps for different RX sampling timings; this connection only affects NT Fixed-Timing mode.

It should be understood that various alternatives to the embodiment of the invention described herein may be employed in practicing the invention. It is intended that the following claims define the scope of the invention an that the structure within the scope of these claims and its equivalents be covered thereby.

What is claimed is:

1. A quotient digital phase locked loop, comprising:
   (a) binary phase detector means which compares an incoming signal to an internally-generated baud clock signal to provide a phase error bit sequence which indicates whether the phase of the incoming signal is early or late with respect to the phase of the baud clock signal; and (b) a digital controlled clock which integrates the phase error bit sequence to effect nonperiodic phase manipulation of the baud clock signal.

2. A quotient digital phase locked loop as in claim 1 wherein the digital controlled clock includes quotient processor means which divides a sequential accumulator value by a divisor constant each period defined by a crystal clock input to the digital controlled clock, the division resulting in a quotient value and a remainder value, the quotient value being only 0 or 1, the remainder value for successive divisions being added until the sum of the remainder values equals or exceeds a predetermined value, the quotient value equalling 0 only when the remainder value sum equals or exceeds the predetermined value, resulting in a quotient value bit stream comprising a sequence of 1s and nonperiodic 0s, the quotient value bit stream being utilized to effect nonperiodic phase manipulation of the baud clock signal.

3. A quotient digital phase locked loop as in claim 1 and further including a range-phase detector which generates an output indicative of whether the phase of the output of the digital controlled clock is within a predetermined phase range.

4. A quotient digital phase locked loop as in claim 3 wherein the range-phase-detector output is utilized to dynamically change the frequency of phase manipulation of the baud clock signal.

5. A quotient digital phase locked loop as in claim 1 and further including means for avoiding phase manipulation during a predefined condition.

6. A quotient digital phase locked loop as in claim 1 and further including means for disabling phase manipulation during a predetermined period.

7. A quotient digital phase locked loop as in claim 1 and further including means for dynamically varying the loop time constant to obtain wide capture range and low jitter.

8. A quotient digital phase locked loop as in claim 5 wherein the predefined condition is a lack-of-strobe condition.

9. A quotient digital phase locked loop as in claim 6 wherein the predetermined period is a period when no timing information is available.

* * * * *